United States Patent
Takamiya

(10) Patent No.: US 6,919,166 B2
(45) Date of Patent: Jul. 19, 2005

(54) METHOD FOR PREPARING LITHOGRAPHIC PRINTING PLATE

(75) Inventor: Shuichi Takamiya, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 24 days.

(21) Appl. No.: 10/361,821

(22) Filed: Feb. 11, 2003

(65) Prior Publication Data

US 2003/0194653 A1 Oct. 16, 2003

(30) Foreign Application Priority Data

Feb. 21, 2002 (JP) .................................... 2002-044221
Jun. 11, 2002 (JP) .................................... 2002-170440

(51) Int. Cl.$^7$ ................................................ G03F 7/32
(52) U.S. Cl. .................. 430/302; 430/309; 430/434; 430/435; 430/494; 430/944; 430/945; 101/463.1; 101/465; 101/467
(58) Field of Search ............................. 430/270.1, 302, 430/309, 348, 434, 435, 494, 944, 945; 101/463.1, 465, 467

(56) References Cited

U.S. PATENT DOCUMENTS 6,329,122 B2 * 12/2001 Hotta et al. ............... 430/278.1
6,511,790 B2 * 1/2003 Takamiya .................... 430/302
2001/0037742 A1    11/2001 Ohnishi
2003/0099909 A1 *  5/2003 Takamiya .................... 430/331

FOREIGN PATENT DOCUMENTS

| EP | 0 949 539 A2 | 10/1999 |
| EP | 0 965 887 A1 | 12/1999 |
| EP | 1 120 246 A  | 8/2001  |
| EP | 1 162 063 A  | 12/2001 |
| GB | 2276729 A    | 10/1994 |
| JP | 07-285275    | 10/1995 |
| JP | 11-338126    | 12/1999 |
| JP | 2000-112147  | 4/2000  |

* cited by examiner

Primary Examiner—Barbara L. Gilliam
(74) Attorney, Agent, or Firm—Burns, Doane, Swecker & Mathis, L.L.P.

(57) ABSTRACT

A method for preparing a lithographic printing plate is disclosed, and said method comprises the steps of image-wise light-exposing to infrared radiation, a presensitized plate for use in making a lithographic printing plate, said presensitized plate having an image-forming layer which comprises an IR-absorbing agent, and developing the light-exposed plate with an alkaline liquid developer comprising a polyhydric alcohol-type alkylene oxide adduct.

8 Claims, No Drawings

METHOD FOR PREPARING LITHOGRAPHIC PRINTING PLATE

FIELD OF THE INVENTION

The present invention relates to a method for preparing a lithographic printing plate from a lithographic printing plate precursor, i.e., a presensitized plate for use in making a lithographic printing plate (hereinafter possibly referred to as "PS plate") which is directly imageable by scanning an infrared (IR) laser on the basis of digital signals through a computer, etc., i.e., a directly-imageable lithographic printing plate precursor.

BACKGROUND OF THE INVENTION

Recently, progress of technique on a laser has been remarkable, and particularly, a solid state laser or semiconductor laser having an emission range of from near infrared ray to infrared ray is very useful as a light exposure source in a system wherein a printing plate precursor is directly imaged by digital data, since such laser of high powered and compact type has been easily available.

As an image recording material suitable for laser-writing, for example, Japanese Patent Un-examined Publication (hereunder referred to as "J.P. KOKAI") No. Hei 7-285275 has suggested a positive-working image recording material comprising (a) a binder such as a cresol resin, (b) a compound which absorbs light so as to generate the heat, and (c) a compound such as quinonediazide which is heat-decomposable, whose pre-decomposition state being capable of substantially decreasing a solubility of said binder. The mechanism of this material is that on IR radiation, the light-exposed area becomes alkaline-soluble, since the compound (b) generates the heat in the light-exposed area and then the compound (c) is decomposed (i.e., heat-mode type). However, the generated heat is absorbed in some degree by a substrate aluminum plate and so the thermal efficiency of this mechanism is poor, and therefore the solubility of the light-exposed area to an alkaline liquid developer is not satisfactory in a development process. Consequently, alkaline strength of a liquid developer must be raised to ensure the solubility of the light-exposed area.

On the other hand, in the lithographic printing plate precursor of heat-mode type, the resistance of non-heated areas (i.e., image areas) to dissolution in an alkaline liquid developer is poor under the above highly alkaline concentration, and when the image recording material has slightly scratches on the surface thereof, said scratched areas may be easily dissolved. Accordingly, there is a problem such that the image areas, particularly fine line areas and the like are easily impaired. This tendency is particularly serious in a positive-working lithographic printing plate precursor employing a polymeric compound which is highly soluble to an alkaline aqueous solution.

Consequently, the raise in alkaline strength of a liquid developer should be limited, though said raise in alkaline strength is intended not to leave undissolved residue on non-image areas, and it is also difficult to form a highly sharp and clear image without impairment to the formed image areas. There is therefore a need for improved sharpness and improved reproducibility of images, particularly fine images comprising a dot pattern, fine lines and the like. For the purpose of meeting the need, addition of various surfactants to a liquid developer has been researched, and this attempt can attain an effect to some extent in obtaining sharpness of images. However, it becomes a subject of discussion that the performance of the surfactant is decreased through dissolution of components of a light-sensitive layer into the liquid developer.

Incidentally, in association with recent improvement on image recording materials of IR-laser exposure type, it tends to use an IR-absorbing dye such as a cyanine dye in the image recording material, which absorber is more insoluble in an alkaline liquid developer than a conventionally used IR-absorbing dye. When such image recording material is processed in an alkaline liquid developer, insoluble matter originated from the IR-absorbing dye possibly appears in the developer, and such insoluble matter may interact with a component of binder polymers in the image recording material or inorganic substances in water to generate further insoluble matter. The above insoluble matter may adhere to a plate during development procedure in making a printing plate, and then image areas of the plate may be impaired. In addition, the insoluble matter is precipitated and deposited in a processing tank and disadvantageously leads to a large labor or cost for maintenance of processing tanks. Under such circumstances, for example, when the burning treatment is supplied to a plate retaining residue on non-image areas, the residue is carbonized to cause possibly scumming during printing.

Thus it has been required that the disadvantages by the insoluble matter originated from a component of image-forming layer such as an IR-absorbing agent and the like are eliminated, a highly sharp and clear image is formed without impairment to the formed image areas, and sharpness and reproducibility of images, particularly fine images comprising a dot pattern, fine lines and the like are improved.

SUMMARY OF THE INVENTION

Accordingly, an object of the present invention is to overcome the above conventional drawbacks and provide a method for preparing a lithographic printing plate wherein a highly sharp and clear image can be formed without damages to the formed image areas. An another object of the present invention is to provide a method for preparing a lithographic printing plate wherein even if components of an image-forming layer dissolve into a liquid developer in the process of development, a certain performance is exhibited so as to suppress the occurrence of developing sludge originated from the components of an image-forming layer.

The inventor of the present invention has conducted various studies to accomplish the foregoing objects, and has found that the addition of a specific compound to an alkaline liquid developer enables the developer to form a highly sharp and clear image in a lithographic printing plate and to disperse favorably the developing sludge. Thus the inventor has completed the present invention.

Consequently, the present invention is directed to a method for preparing a lithographic printing plate comprising the steps of imagewise light-exposing to infrared radiation, a presensitized plate for use in making a lithographic printing plate, said presensitized plate having an image-forming layer which comprises an IR-absorbing agent, and then developing the light-exposed plate with an alkaline liquid developer comprising a polyhydric alcohol-type alkylene oxide adduct.

The method for preparing a lithographic printing plate according to the present invention is explained briefly below. The method of the present invention uses a PS plate having at least an image-forming layer on a substrate, said image-forming layer comprising an IR-absorbing agent. The PS plate is desirably-imagewise exposed to the light for example, by means of infrared radiation laser based on digital signals, and so the IR-absorbing agent in the image-forming layer efficiently absorbs the laser light so as to convert the laser light into heat energy to form a image through the following mechanism.

Namely, in case of a positive-working lithographic printing plate precursor, merely the light-exposed area of the image-forming layer generates the heat through accumulation of absorbed energy by light exposure so as to become alkaline-soluble. The alkaline developer removes merely the light-exposed area so as to form the desirable image. In case of a negative-working lithographic printing plate precursor, the light-exposed area of the image-forming layer generates the heat through accumulation of absorbed energy by light exposure so as to generate an acid, and said acid makes a coexistent crosslinking-agent start a crosslinking reaction, and so merely the light-exposed area becomes alkaline-nonsoluble to form an image. On the other hand, the non-exposed area is removed by an alkaline developer so as to form a desirable image.

DETAILED DESCRIPTION OF THE INVENTION

The present invention will be described in more detail below.

The alkaline liquid developer (hereinafter possibly referred to as simply "developer") used in the present invention is fundamentally an alkaline aqueous solution, and the composition of said alkaline aqueous solution can be selected from conventional ones.

The alkaline aqueous solution includes an alkaline aqueous solution comprising an alkaline silicate or a nonreducing sugar, and a base, said solution's pH being preferably from 12.5 to 14.0. The alkaline silicate may be ones exhibiting an alkalinity when dissolved in water, and examples thereof include an alkali metal silicate such as sodium silicate, potassium silicate and lithium silicate, and ammonium silicate. Said alkaline silicate may be used alone, or in combination.

The development performance of the alkaline aqueous solution may be easily modulated by adjusting a molar ratio of silicon oxide ($SiO_2$) and an alkali oxide ($M_2O$, wherein M represents an alkali metal or an ammonium group) which are components of the alkaline silicate, and concentrations thereof.

The alkaline aqueous solution has preferably the molar ratio between silicon oxide ($SiO_2$) and an alkali oxide ($M_2O$) ($SiO_2/M_2O$: molar ratio) of from 0.5 to 3.0, and more preferably from 1.0 to 2.0. If the molar ratio, $SiO_2/M_2O$ is less than 0.5, alkalinity of the solution will increase so as to cause a harmful effect such as etching of an aluminum plate which is generally used as a substrate in a lithographic printing plate precursor. If the molar ratio, $SiO_2/M_2O$ is more than 3.0, the development performance of the solution may possibly be degraded.

The concentration of alkaline silicate in the developer ranges generally from 1 to 10% by weight, preferably from 3 to 8% by weight, and more preferably from 4 to 7% by weight. If said concentration is less than 1% by weight, the development performance or treatment capacity may be degraded. If said concentration is more than 10% by weight, precipitated materials or crystals may be easily generated, and gelation may be easily caused during neutralization of waste liquid, resulting in an obstacle to the waste disposal.

In the developer based on an alkaline aqueous solution comprising a nonreducing sugar and a base, the nonreducing sugar denotes sugars having no reductive property due to the absence of a free aldehyde group or a free ketone group. Said nonreducing sugar is classified into trehalose-type oligosaccharides wherein a reductive group and another reductive group make a linkage; glycosides wherein a reductive group in a sugar is linked to a non-sugar compound; and sugar alcohols which are produced by reducing a sugar with hydrogenation.

Said trehalose-type oligosaccharides include sucrose and trehalose, and said glycosides include alkyl glycosides, phenol glycosides, mustard oil glycosides and the like.

Said sugar alcohols include D,L-arabitol, ribitol, xylitol, D,L-sorbitol, D,L-mannitol, D,L-iditol, talitol, dulcitol, allodulcitol and the like.

Further, maltitol obtained by hydrogenation of disaccharide, a reduced material obtained by hydrogenation of oligosaccharide (a reduced starch syrup) and the like are preferably used.

In the above nonreducing sugar, preferred are sugar alcohols and sucrose, and particularly preferred are D-sorbitol, sucrose and a reduced starch syrup, since they have buffering action in appropriate pH range.

The above nonreducing sugar may be used alone or in combination, and the concentration thereof in the developer ranges generally from 0.1 to 30% by weight, and preferably from 1 to 20% by weight.

In the developer, an alkaline agent may be used as a base in combination with the above mentioned alkaline silicate or nonreducing sugar, and said alkaline agent may be selected from those well known.

The alkaline agent includes inorganic alkaline agents such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like.

The alkaline agent also includes organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like.

Among these alkaline agents, preferred are sodium hydroxide and potassium hydroxide, since the amount of them with respect to the nonreducing sugar can be varied to allow pH adjustment in broad range of pH. Further, sodium tertiary phosphate, potassium tertiary phosphate, sodium carbonate and potassium carbonate are also preferable, since they have themselves, buffering action.

The above alkaline agent may be used alone or in combination.

The developer used in the present invention comprises a polyhydric alcohol-type alkylene oxide adduct in the above alkaline aqueous solution.

The polyhydric alcohol-type alkylene oxide adduct for use in the present invention includes specifically an alkylene oxide adduct of polyhydric alcohol. More specifically, there are the compounds represented by the following general formula (I):

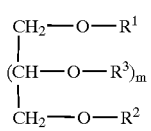
(I)

wherein m represents an integer of from 1 to 10, $R^1$, $R^2$ and $R^3$ represent each independently hydrogen atom or a group of formula (II):

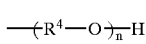
(II)

(wherein $R^4$ represents an alkylene group and n represents an integer of from 1 to 100), and when m is 2 or more, the 2 or more of $R^3$ are the same or different, provided that at least one of $R^1$, $R^2$ and $R^3$ represents the group of formula (II).

In the formula (I), m is preferably from 1 to 4. In the formula (II), $R^4$ is preferably an alkylene group having 1 to 6 carbon atoms, and more preferably an alkylene group having 2 to 4 carbon atoms. The alkylene group may consist of different alkylene groups, for example, an ethyleneoxy group and a propyleneoxy group, an ethyleneoxy group and an isopropyleneoxy group, an ethyleneoxy group and a butyleneoxy group, or an ethyleneoxy group and an isobutyleneoxy group, and these groups may be arrayed in the form of random or block copolymer.

In the formula (II), n is an integer of 1 to 100, and in the compound of the formula (I), the total number of moles of addition alkyleneoxides is generally from 4 to 100, preferably from 6 to 80, more preferably from 10 to 50, and most preferably form 12 to 40.

Specific examples of the compound represented by the formula (I) are alkylene oxide adducts of a sugar alcohol such as D,L-threite, D,L-arabite, ribite, xylite, D,L-sorbite, D,L-mannite, D,L-idite, D,L-talite, dulcite and allodulcite, and alkylene oxide adducts of glycerin.

The alkylene oxide adduct of polyhydric alcohol includes further, an alkylene oxide adduct of a polyglycerin which may be obtained by condensation of sugar alcohol, which polyglycerin including diglycerin, triglycerin, tetraglycerin, pentaglycerin, hexaglycerin and the like.

The addition of alkylene oxide may be in the form of, for example, ethylene oxide (EO) addition, ethylene oxide (EO)/propylene oxide (PO) addition, and propylene oxide (PO) addition, and the propylene oxide (PO) may exist desirably to the extent of acceptable water-solubility which resides in the compound. Among these, EO adduct of sorbite, PO adduct of sorbite, EO adduct of xylite, PO adduct of xylite, EO adduct of threite, PO adduct of threite, EO adduct of glycerin, PO adduct of glycerin, EO adduct of diglycerin and EO adduct of triglycerin are specifically exemplified.

These compounds are commercially available in the market, and an example of commercial product thereof includes Sorbitol EO(30) which is a trade name of a product manufactured by Nikko Chemicals Co., Ltd. and the like.

The alkylene oxide adduct of polyhydric alcohol used in the present invention has preferably a molecular weight of from 50 to 10,000, more preferably from 100 to 5,000, and most preferably from 500 to 3,500. When the molecular weight thereof is less than 50, the inhibitive power against the solubility of image areas may not be obtained sufficiently, and when the molecular weight thereof is more than 10,000, the development performance of developer to the non-image areas will be possibly degraded.

The alkylene oxide adduct of polyhydric alcohol may be used alone or in combination and the amount thereof in the alkaline liquid developer ranges generally from 0.001 to 10% by weight, preferably from 0.05 to 5% by weight, and more preferably from 0.1 to 3% by weight. When the amount is less than 0.001% by weight, it will possibly not inhibit sufficiently the solubility of the formed image areas. When the amount is more than 10% by weight, the inhibitive power against the solubility of image areas may be too strong and development sensitivity will be possibly degraded.

The use of the above compound in an alkaline liquid developer is capable of forming an edge-form, highly sharp and clear image without impairment to the formed image areas caused by dissolution of the image, even if a highly alkali-soluble high molecular weight compound is employed in an image-forming layer or an alkaline concentration of the developer is heightened. Thus the use of the above component in an alkaline liquid developer is capable of reproducing sharply fine images such as dot patterns, fine lines and the like.

The alkaline liquid developer used in the present invention comprises an alkaline silicate or a nonreducing sugar, and a base, as described above. As the cationic component thereof, $Li^+$, $Na^+$, $K^+$ and $NH_4^+$ are conventionally used. In particular, a developer system comprising lot of the cation which has a small ionic radius is highly penetrative to an image-forming layer, such system being excellent in development performance, however, the system also dissolves the image area and causes impairment of the image. Accordingly, the increase of alkaline concentration should be limited to a certain extent, and it is in need of setting of subtle liquid condition in order that simultaneously impairment of the image and the image-forming layer which is left on non-image areas (undissolved residue) may not be generated.

However, the use of cation which has relatively large ionic radius in a developer inhibits the penetration of developer into an image-forming layer, and so it is possible to improve an inhibitive power against the solubility of image areas without decrease of alkaline concentration, i.e., without decrease of the development performance.

As the cationic component, other cations than alkaline metal cations and ammonium cation may be used.

The alkaline liquid developer used in the present invention may comprise the following additives so as to enhance the performance of development: for example, neutral salts such as NaCl, KCl and KBr disclosed in J.P. KOKAI No. Sho 58-75152, chelating agents such as EDTA, NTA and the like disclosed in J.P. KOKAI No. Sho 58-190952, complex compounds such as $[Co(NH_3)_6]Cl_3$ and $CoCl_2.6H_2O$ disclosed in J.P. KOKAI No. Sho 59-121336, anion or amphoteric surfactants such as sodium alkyl naphthalene sulfonate, N-tetradecyl-N,N-dihydroxyethyl betaine and the like disclosed in J.P. KOKAI No. Sho 50-51324, nonionic surfactants such as tetramethyl decynediol disclosed in U.S. Pat. No. 4,374,920, cationic polymers such as quaternary methyl chloride of p-dimethylamino methyl polystyrene disclosed in J.P. KOKAI No. Sho 55-95946, amphoteric polymeric electrolyte such as a copolymer of vinylbenzyl trimethylammonium chloride and sodium acrylate disclosed in J.P. KOKAI No. Sho 56-142528, reducing inorganic salts such as sodium sulfite disclosed in J.P. KOKAI No. Sho 57-192951, inorganic lithium salts such as lithium chloride disclosed in J.P. KOKAI No. Sho 58-59444, organic metal surfactant comprising organic Si, Ti and the like disclosed in J.P. KOKAI No. Sho 59-75255, organic boron compounds disclosed in J.P. KOKAI No. Sho 59-84241, quaternary ammonium salts such as tetraalkyl ammonium oxide disclosed in EP 101010, and the like.

The manner of use on the alkaline liquid developer according to the present invention is not specifically limited. Recently, in order to realize rationalization and standardization of plate making procedure in the field of plate-making and printing industries, automatic processors for printing plate have been widely used. The alkaline liquid developer according to the present invention may be used in the automatic processor.

The above automatic processor commonly comprises a developing zone and a post-treating zone, and also comprises a device for transporting PS plates, a tank for processing solutions, and a spray device, wherein a light-exposed plate is carried horizontally, and processed by spraying each processing solution from a nozzle which solution is pumped up. Recently, it has also been known a method wherein a PS plate is conveyed and immersed in a processing tank filled up with a processing solution through the action of dipped guide roll to thus develop the plate. In these automatic treatments, the treatment may be performed while supplementing a replenisher to each processing tank, in proportion to the quantity of PS plates processed and the running time of the processor.

In this case, an aqueous solution which has the higher alkalinity than the developer can be used as a replenisher into the developer so as to treat a large amount of PS plate over an extended period without a replacement of developer in a processing tank. Since the alkaline liquid developer of the present invention facilitates a highly concentrated composition, it is a preferable embodiment to employ the above supplementary manner.

In other words, the alkaline liquid developer described above may be used as a replenisher, which has a higher alkalinity and a higher concentration with respect of ingredients than those of an initial developer.

The above alkaline liquid developer and a replenisher may further comprise various surfactants, organic solvents and the like in order to enhance or control development performance, and enhance dispersion of sludge appearing during development procedure and an ink-affinity of image areas on a plate. Such surfactant used in the developer may be selected from non-ionic, anionic, cationic and amphoteric surfactants. The organic solvent used in the developer includes benzyl alcohol and the like. To the above alkaline liquid developer and replenisher, polyethylene glycol and/or the derivatives thereof, or polypropylene glycol and/or derivative thereof may be also added.

Further, as occasion demands, there may be added to the developer or replenisher, hydroquinone, resorcin, inorganic salt reductants such as sodium or potassium salt of sulfurous acid or bisulfurous acid, organic carboxylic acid, antifoaming agents and water softeners.

The lithographic printing plate obtained by processing a PS plate with the alkaline liquid developer and optionally a replenisher according to the present invention may be further subjected to post-treatments with any of washing-water, a rinsing solution which commonly comprises a surfactant and a desensitizing gum solution which comprises for instance, gum arabic and starch derivatives. The plates can be subjected to any combination of these post-treatments.

The PS plate can be processed by a so-called throwaway-processing system in which the PS plate is processed with a substantially flesh processing solution.

Then, the lithographic printing plate precursor for use in the plate-making method according to the present invention will hereunder be described in detail below.

The lithographic printing plate precursor comprises a substrate, an image-forming layer applied onto the substrate and further an optional other layer. The image-forming layer comprises (A) an IR-absorbing agent, and further optionally (B1) an alkali-soluble high molecular weight compound having a carboxyl group, (B2) an alkali-soluble resin, (C) a compound, which may be compatible with (B1) an alkali-soluble high molecular weight compound and (B2) an alkali-soluble resin to thus reduce the solubility of the alkali-soluble high molecular weight compound and the resin in an alkaline liquid developer and whose effect of reducing the solubility of the polymeric compound is lowered through heating, and (D) a cyclic acid anhydride. Moreover, in case of a negative-working lithographic printing plate precursor, the light-exposed area is cured to give an image area and therefore, the image-forming layer further comprises (E) a compound capable of generating an acid through heating and (F) a crosslinking agent capable of causing crosslinking by the action of an acid. Each ingredient of the lithographic printing plate precursor will briefly be described below.

(A) IR-Absorbing Agent

The IR-absorbing agent (hereunder also referred to as "component (A)") serves to convert infrared rays absorbed into heat.

As IR-absorbing agents, which may be used in the present invention, there may be listed, for instance, dyes or pigments capable of absorbing, at a high rate, infrared rays having a wavelength of not less than 700 nm and preferably infrared rays falling within the range of from 750 to 1200 nm, with dyes or pigments having an absorption peak falling within the range of from 760 to 1200 nm being more preferred.

The foregoing dye materials may be commercially available ones or those known in the literature (see, for instance, "SENRYO BINRAN", edited by YUKI GOSEI KAGAKU KYOKAI, Published in Showa 45 (1970)) and specific examples thereof are azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes and metal thiolate complexes.

Among them, preferably used herein include, for instance, cyanine dyes such as those disclosed in, for instance, Japanese Un-Examined Patent Publication Nos. Sho 58-125246, Sho 59-84356, Sho 59-202829 and Sho 60-78787; methine dyes such as those disclosed in, for instance, Japanese Un-Examined Patent Publication Nos. Sho 58-173696, Sho 58-181690 and Sho 58-194595; naphthoquinone dyes such as those disclosed in, for instance, Japanese Un-Examined Patent Publication Nos. Sho 58-112793, Sho 58-224793, Sho 59-48187, Sho 59-73996, Sho 60-52940 and Sho 60-63744; squarylium dyes such as those described in, for instance, Japanese Un-Examined Patent Publication No. Sho 58-112792; cyanine dyes such as those disclosed in, for instance, G.B. Patent No. 434,875; and dihydropyrimidine squarylium dyes such as those described in, for instance, U.S. Pat. No. 5,380,635.

Preferably used herein also include, for instance, sensitizing agents capable of absorbing near infrared rays disclosed in U.S. Pat. No. 5,156,938; substituted arylbenzo (thio) pyrylium salts disclosed in U.S. Pat. No. 3,881,924; trimethine thiopyrylium salts disclosed in Japanese Un-Examined Patent Publication No. Sho 57-142645 (U.S. Pat. No. 4,327,169); pyrylium compounds disclosed in Japanese Un-Examined Patent Publication Nos. Sho 58-181051, Sho 58-220143, Sho 59-41363, Sho 59-84248, Sho 59-84249, Sho 59-146063 and 59-146061; cyanine dyes disclosed in Japanese Un-Examined Patent Publication No. Sho 59-216146; pentamethine thiopyrylium salts disclosed in U.S. Pat. No. 4,283,475; pyrylium compounds disclosed in Japanese Examined Patent Publication Nos. Hei 5-13514 and Hei 5-19702; and commercially available ones such as Epolight III-178, Epolight III-130, Epolight III-125 and Epolight IV-62A (available from Epoline Company).

Preferably used herein also include near infrared ray-absorbing dyes such as those represented by the general formulas (I) and (II) disclosed in U.S. Pat. No. 4,756,993.

Among these, more preferably used herein are cyanine dyes, squarylium dyes, pyrylium dyes and nickel thiolate complexes.

As the foregoing pigments, there may be listed, for instance, commercially available pigments or those disclosed in, for instance, Color Index (C.I.) BINRAN ("SAISHIN GANRYO BINRAN", edited by NIPPON GANRYO GIJUTSU KYOKAI, 1977), "SAISHIN GANRYO OYO GIJUTSU", CMC Publishing Company, 1986, "INSATSU INKU GIJUTSU", CMC Publishing Company, 1984 and examples thereof are black pigments, yellow pigments, orange pigments, brown pigments, red pigments, purple pigments, blue pigments, green pigments, fluorescent pigments, powdery metal pigments and other polymer-bonded dyes.

Specific examples thereof include insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments and carbon black.

Among them, preferred is carbon black.

The foregoing pigments may be used after subjecting them to surface treatments or without any surface treatment.

Such surface treatments may be, for instance, a method comprising coating the surface thereof with a resin or a wax, a method comprising adhering a surfactant to the surface of these pigments, and a method comprising bonding a reactive substance (such as a silane-coupling agent, an epoxy compound or polyisocyanate) to the surface of these pigments. These surface treating methods are disclosed in "Characteristic Properties and Applications of Metal soaps", SAIWAI Publishing Company, "SAISHIN GANRYO OYO GIJUTSU", CMC Publishing Company, 1986 and "INSATSU INKU GIJUTSU", CMC Publishing Company, 1984.

The particle size of the foregoing pigments preferably ranges from 0.01 to 10 µm, more preferably 0.05 to 1 µm and most preferably 0.1 to 1 µm.

This is because if the particle size is less than 0.01 µm, the dispersed substances present in prepared dispersions such as a coating liquid for forming a light-sensitive layer sometimes have deteriorated stability, while if it exceeds 10 µm, the uniformity of the resulting image-forming layer is often impaired.

Methods for dispersing a pigment in a medium may appropriately be selected from known dispersion techniques such as those, which make use of, for instance, a dispersing device widely used in, for instance, ink-manufacturing and toner-manufacturing techniques.

The foregoing dispersing devices may be, for instance, ultrasonic dispersing devices, sand mills, attritors, pearl mills, super mills, ball mills, impellers, dispersers, KD mills, colloid mills, dynatrons, three roll mills and pressurized kneaders. These devices are detailed in, for instance, "SAISHIN GANRYO OYO GIJUTSU", CMC Publishing Company, 1986.

The content of the foregoing dye or pigment preferably ranges from 0.01 to 50% by weight, more preferably 0.1 to 10% by weight and most preferably 0.5 to 10% by weight for dyes and 3.1 to 10% by weight for pigments, on the basis of the total solid content (by weight) of the image-forming layer.

If the content of the dye or pigment is less than 0.01% by weight, the resulting image-forming layer has a reduced sensitivity, while if it exceeds 50% by weight, the uniformity of the resulting image-forming layer is sometimes impaired and the durability thereof is often deteriorated.

The foregoing dye or pigment may be added to the same layer together with other components or may be added to a separate layer. When it is added to a separate layer, it is preferred to add the same to a layer adjacent to the component (C)-containing layer as will be detailed later.

In addition, the dye or pigment is preferably incorporated into the layer containing the alkali-soluble high molecular weight compound, but these components may be added to separate layers.

(B1) Alkali-Soluble High Molecular Weight Compound Having Carboxyl Group (hereunder also referred to as "component (B1)")

As component (B1), any of alkali-soluble high molecular weight compound having a carboxyl group can be used, and preferred are high molecular weigh compounds (b1-1) and (b1-2) which are defined below.

(b1-1) Alkali-soluble high molecular weight compound having a polymerizable monomer unit represented by the following general formula (III) (hereunder also referred to as "high molecular weight compound (b1-1)")

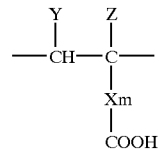

(III)

wherein Xm represents a single bond or a bivalent connecting group, Y represents hydrogen atom or a carboxyl group, and Z represents hydrogen atom, alkyl or carboxyl group.

A monomer constructing the monomer unit of the formula (III) includes a polymerizable monomer having at least one carboxyl group and at least one polymerizable unsaturated group in the molecule thereof. Specific examples of the polymerizable monomer are α,β-unsaturated carboxylic acids such as acrylic acid, methacrylic acid, maleic acid, maleic anhydride, itaconic acid, itaconic anhydride and the like.

A monomer which is copolymerized with the above polymerizable monomer having a carboxyl group includes those listed below as (1) to (11), but the present invention is not restricted to these specific ones at all:

(1) acrylic acid esters and methacrylic acid esters each carrying an aliphatic hydroxyl group such as 2-hydroxyethyl acrylate and 2-hydroxyethyl methacrylate;

(2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;

(3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;

(4) acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;

(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) vinyl esters such as vinyl acetate, vinyl chloroacetate, vinyl butyrate and vinyl benzoate;

(7) styrenes such as styrene, α-methyl styrene, methyl styrene and chloromethyl styrene;

(8) vinyl ketones such as methyl vinyl ketone, ethyl vinyl ketone, propyl vinyl ketone and phenyl vinyl ketone;

(9) olefins such as ethylene, propylene, isobutylene, butadiene and isoprene;

(10) N-vinyl pyrrolidone, N-vinyl carbazole, 4-vinyl pyridine, acrylonitrile, methacrylonitrile or the like;

(11) unsaturated imides such as maleimide, N-acryloyl acrylamide, N-acetyl methacrylamide, N-propionyl methacrylamide and N-(p-chlorobenzoyl) methacrylamide.

Alternatively, a monomer represented by the following general formula (IV) may be preferably used.

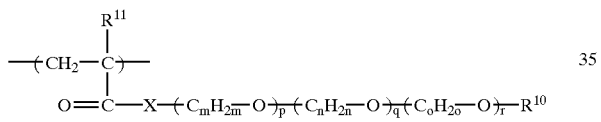

(IV)

wherein X represents O, S or N—$R^{12}$; $R^{10}$ to $R^{12}$ represent each independently hydrogen atom or an alkyl group; m, n and o represent each independently an integer of from 2 to 5; $C_mH_{2m}$, $C_nH_{2n}$ and $C_oH_{2o}$ are independently in the form of linear or branched chain; p, q and r represent each independently an integer of from 0 to 3,000, and p+q+r≧2.

The alkyl group represented by $R^{10}$ to $R^{12}$ is preferably an alkyl group having 1 to 12 carbon atoms, and specifically includes methyl, ethyl, n-propyl and isopropyl groups and the like. In the formula, p, q and r represent preferably an integer of from 0 to 500, and more preferably from 0 to 100.

Examples of monomers corresponding to the repeating unit represented by the formula (IV) are listed below, but the present invention is not restricted to these specific ones at all.

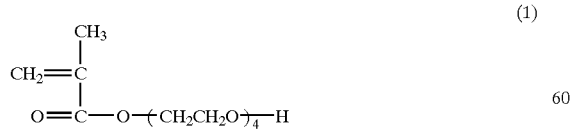
(1)

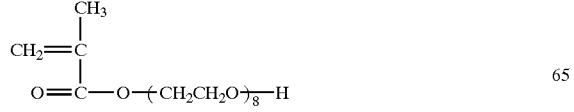
(2)

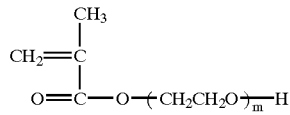
(3)

(Average Molecular Weight of Alkyleneoxides: 1000)

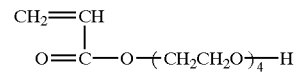
(4)

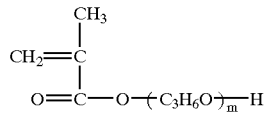
(5)

(Average Molecular Weight of Alkyleneoxides: 1000)

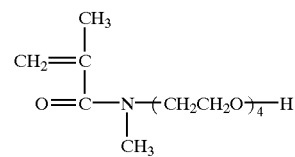
(6)

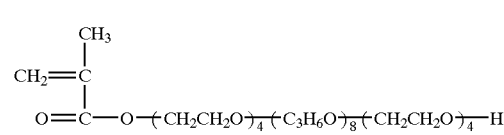
(7)

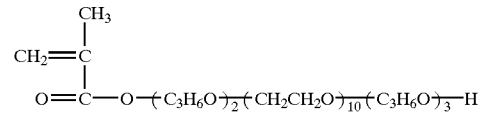
(8)

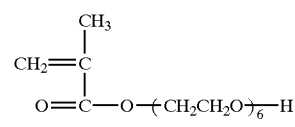
(9)

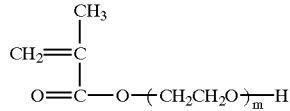
(10)

(Average Molecular Weight of Alkyleneoxides: 500)

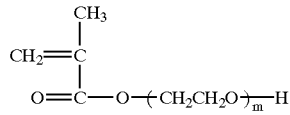
(11)

(Average Molecular Weight of Alkyleneoxides: 2000)

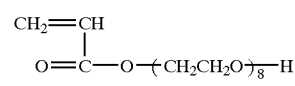
(12)

-continued

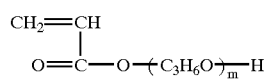

(13)

(Average Molecular Weight of Alkyleneoxides: 1500)

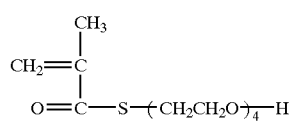

(14)

The repeating unit represented by the formula (IV) can be prepared by reacting a commercially available hydroxy poly(oxyalkylene) material such as Pluronic (trade name) manufactured by Asahi Dennka Kogyo Co., Ltd., AdekaPolyether (trade name) manufactured by Asahi Dennka Kogyo Co., Ltd., Carbowax (trade name) manufactured by Glyco Products, Toriton (trade name) manufactured by Rohm and Haas and P.E.G manufactured by Dai-ichi Kogyo Seiyaku Co., Ltd., with acrylic acid, methacrylic acid, acrylchloride, methacrylchloride, acrylic anhydride or the like in a well known method.

Alternatively, poly(oxyalkylene) diacrylate can be used, which is prepared by a well known method.

Commercially available monomers include a hydroxyl-terminated polyalkylene glycol mono(meth)acrylate manufactured by Nippon Yushi Co., Ltd. such as Blenmer PE-90, Blenmer PE-200, Blenmer PE-350, Blenmer AE-90, Blenmer AE-200, Blenmer AE-400, Blenmer PP-1000, Blenmer PP-500, Blenmer PP-800, Blenmer AP-150, Blenmer AP-400, Blenmer AP-550, Blenmer AP-800, Blenmer 50PEP-300, Blenmer 70PEP-350B, Blenmer AEP Series, Blenmer 55PET□400, Blenmer 30PET-800, Blenmer 55PET-800, Blenmer AET Series, Blenmer 30PPT-800, Blenmer 50PPT-800, Blenmer 70PPT-800, Blenmer APT Series, Blenmer 10PPB-500B, Blenmer 10APB-500B and the like. Similarly, there are an alkyl-terminated polyalkylene glycol mono(meth)acrylate manufactured by Nippon Yushi Co., Ltd. such as Blenmer PME-100, Blenmer PME-200, Blenmer PME-400, Blenmer PME-1000, Blenmer PME-4000, BlenmerAME-400, Blenmer 50POEP-800B, Blenmer 50AOEP-800B, Blenmer PLE-200, Blenmer ALE-200, Blenmer ALE-800, Blenmer PSE-400, Blenmer PSE-1300, Blenmer ASEP Series, Blenmer PKEP Series, Blenmer AKEP Series, Blenmer ANE-300, Blenmer ANE-1300, Blenmer PNEP Series, Blenmer PNPE Series, Blenmer 43 ANEP-500, Blenmer 70ANEP-550, and products manufactured by Kyoei Chemicals Co., Ltd. such as Light Ester MC, Light Ester 130MA, Light Esters 041MA, Light Acrylate BO-A, Light Acrylate EC-A, Light Acrylate MTG-A, Light Acrylate 130A, Light Acrylate DPM-A, Light Acrylate P-200A, Light Acrylate NP-4EA, Light Acrylate NP-8EA and the like.

The minimum constitutional unit in the high molecular weight compound (b1-1), which has the polymerizable monomer component having at least one carboxyl group and at least one polymerizable unsaturated group may be alone, or two or more in combination. It is possible to use the compound obtained by copolymerizing two or more minimum constitutional units having the same acidic group, or two or more minimum constitutional units having different acidic groups. A method which is usable for copolymerization may be a conventional method such as a graft copolymerization, a block copolymerization, a random copolymerization and the like.

(b1-2) Alkali-soluble high molecular weight compound having a carboxyl group, which has as a basic skeleton, a reaction product of a diol compound having a carboxyl group represented by the following general formula (V), (VI) or (VII) and a diisocyanate compound represented by the following formula (X) (hereunder also referred to as "high molecular weight compound (b1-2)")

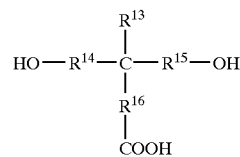

(V)

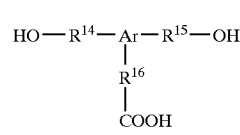

(VI)

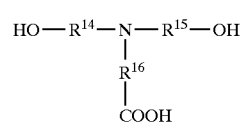

(VII)

wherein $R^{13}$ represents hydrogen atom, or an alkyl, alkenyl, aralkyl, aryl, alkoxy or aryloxy group which may have a substituent such as alkyl, aryl, alkoxy, ester, urethane, amide, ureido and halogeno group, and preferably hydrogen atom, an alkyl group having 1 to 8 carbon atoms, an alkenyl group having 2 to 8 carbon atoms, and an aryl group having 6 to 15 carbon atoms; $R^{14}$, $R^{15}$ and $R^{16}$, which may be the same or different, each represent a single bond, a bivalent aliphatic or aromatic hydrocarbon group which may have a substituent such as alkyl, alkenyl, aralkyl, aryl, alkoxy and halogeno group, preferably an alkylene group having 1 to 20 carbon atoms and an arylene group having 6 to 15 carbon atoms, and more preferably an alkylene group having 1 to 8 carbon atoms.

Where necessary, $R^{14}$, $R^{15}$ and $R^{16}$ may have additionally a functional group which is not reactive to an isocyanate group, such as ester group, urethane group, amide group, ureido group and unsaturated bond between carbons. Two or three of $R^{13}$, $R^{14}$, $R^{15}$ and $R^{16}$ may form a ring together.

Ar represents a trivalent aromatic hydrocarbon group which may have a substituent, and preferably an aromatic group having 6 to 15 carbon atoms.

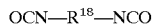

(X)

wherein $R^{18}$ represents a bivalent aliphatic or aromatic hydrocarbon group which may have a substituent such as alkyl, alkenyl, aralkyl, aryl, alkoxy and halogeno group. Where necessary, $R^{18}$ may have additionally a functional group which is not reactive to an isocyanate group, such as ester group, urethane group, amide group, ureido group and unsaturated bond between carbons.

The diol compound having a carboxyl group represented by the formula (V), (VI) or (VII) includes 3,5-dihydroxy benzoic acid, 2,2-bis(hydroxymethyl) propionic acid, 2,2-bis(2-hydroxyethyl) propionic acid, 2,2-bis(3-hydroxypropyl) propionic acid, bis(hydroxymethyl) acetic acid, bis(4-hydroxyphenyl) acetic acid, 4,4-bis(4-hydoxyphenyl) pentanoic acid, tartaric acid, N,N-bis(2-hydroxyethyl)-3-carboxy-propionamide, and the like.

The alkali-soluble high molecular weight compound having a carboxyl group (b1-2) is preferably a reaction product wherein a diol compound represented the following general formula (VIII) or (IX) is combined.

wherein $R^{17}$ each represents hydrogen atom or an alkyl group having 1 to 8 carbon atoms, n represents an integer of 2 or more. The alkyl group having 1 to 8 carbon atoms represented by $R^{17}$ includes methyl, ethyl, isopropyl, n-butyl and isobutyl groups.

Specific examples of the diol represented by the formula (VIII) or (IX) are shown below, but the present invention is not restricted to these specific ones at all.

Examples or the compound represented by the formula (VIII):

HO—(—$CH_2CH_2O$—)$_3$—H
HO—(—$CH_2CH_2O$—)$_4$—H
HO—(—$CH_2CH_2O$—)$_5$—H
HO—(—$CH_2CH_2O$—)$_6$—H
HO—(—$CH_2CH_2O$—)$_7$—H
HO—(—$CH_2CH_2O$—)$_8$—H
HO—(—$CH_2CH_2O$—)$_{10}$—H
HO—(—$CH_2CH_2O$—)$_{12}$—H
Polyethylene glycol (average molecular weight: 1000)
Polyethylene glycol (average molecular weight: 2000)
Polyethylene glycol (average molecular weight: 4000)
HO—(—$CH_2CH(CH_3)O$—)$_3$—H
HO—(—$CH_2CH(CH_3)O$—)$_4$—H
HO—(—$CH_2CH(CH_3)O$—)$_6$—H
Polypropylene glycol (average molecular weight: 1000)
Polypropylene glycol (average molecular weight: 2000)
Polypropylene glycol (average molecular weight: 4000)

Examples or the compound represented by the formula (IX):

HO—(—$CH_2CH_2CH_2O$—)$_3$—H
HO—(—$CH_2CH_2CH_2O$—)$_4$—H
HO—(—$CH_2CH_2CH_2O$—)$_8$—H
HO—(—$CH_2CH_2CH(CH_3)O$—)$_{12}$—H

Specific examples of the diisocyanate compound represented by the formula (X) are aromatic diisocyanate compounds such as 2,4-tolylenediisocyanate, dimer of 2,4-tolylenediisocyanate, 2,6-tolylenediisocyanate, p-xylylenediisocyanate, m-xylylenediisocyanate, 4,4'-diphenylmethan diisocyanate, 1,5-naphthalene diisocyanate and 3,3'-dimethylbiphenyl-4,4'-diisocyanate, aliphatic diisocyanate compounds such as hexamethylene diisocyanate, trimethylhexamethylene diisocyanate, lysine diisocyanate and dimer acid diisocyanate, aliphatic diisocyanate compounds such as isophorone diisocyanate, 4,4'-methylene bis(cyclohexylisocyanate), methylcyclohexane-2,4(2,6)-diisocyanate and 1,3-(isocyanate methyl)cyclohexane, and a reaction product of a diol and a diisocyanate such as an adduct of 1 mole of 1,3-butylene glycol and 2 moles of tolylenediisocyanate.

In the synthesis of the high molecular weight compound (b1-2), a molar ratio of the diisocyanate compound and the diol compound which are used is preferably from 0.8:1 to 1.2:1. When an isocyanate group remains at the terminal of polymers obtained, the polymer can be treated with alcohols or amines to finally synthesize ones free of an isocyanate group.

As the component (B1), any one or any combination of at least two selected from the high molecular weight compounds (b1-1) and (b1-2) can be used.

The amount of the repeating unit having a carboxyl group in the component (B1) is generally 2 mole % or more on the basis of the total monomeric amount in the component (B1), preferably from 2 to 70 mole %, and more preferably from 5 to 60 mole %.

The component (B1) has preferably a weight-average molecular weight of from 3,000 to 300,000, and more preferably from 6,000 to 100,000.

The amount of the compound (B1) in the image forming layer ranges generally from 0.005 to 80% by weight, preferably from 0.01 to 50% by weight, and more preferably from 1 to 20% by weight, based on the total weight of the solid content in the image forming layer. When the amount is less than 0.005% by weight, the effect will not be sufficient, and when the amount is more than 80% by weight, the coating will not be dried sufficiently, or the performance as a light-sensitive material such as sensitivity will be adversely affected.

(B2) Alkali-Soluble Resin

As the alkali-soluble resin (hereunder also referred to as "component (B2)") usable in the present invention, there may be listed, for instance, high molecular weight compounds soluble in an alkali aqueous solution and having the following acidic groups (1) to (3) in their main chains and/or side chains:

(1) phenolic group (—Ar—OH)
(2) sulfonamide group (—$SO_2NH$—R)
(3) substituted sulfonamide type acidic group (hereunder referred to as "active imide group") [—$SO_2NHCOR$, —$SO_2NHSO_2R$, —$CONHSO_2R$].

In the foregoing acidic groups (1) to (3), Ar represents a substituted or unsubstituted divalent aryl coupling group and R represents a substituted or unsubstituted hydrocarbon group.

Specific examples of alkali-soluble high molecular weight compounds will be listed below, but the present invention is not restricted to these specific ones at all.

(1) Examples of alkali-soluble high molecular weight compounds carrying phenolic groups are novolak resins such as polycondensates of phenol with formaldehyde, polycondensates of m-cresol with formaldehyde, polycondensates of p-cresol with formaldehyde, polycondensates of m-/p-mixed cresol with formaldehyde and polycondensates of phenol, cresol (which may be m-, p- or m-/p-mixed cresol) and formaldehyde; or polycondensates of pyrogallol with acetone. In addition, high molecular weight compounds obtained by polymerizing monomers having phenol groups on the side chains may likewise be listed as examples.

Examples of high molecular weight compounds carrying phenolic hydroxyl groups on the side chains are those obtained by homopolymerizing polymerizable monomers consisting of low molecular weight compounds each having at least one phenolic hydroxyl group and at least one polymerizable unsaturated bond or copolymerizing such polymerizable monomers with other polymerizable monomers.

Examples of such monomers carrying phenol groups are acrylamides, methacrylamides, acrylic acid esters, methacrylic acid esters or hydroxystyrenes, which have phenol groups on the side chains.

Specific examples thereof preferably include N-(2-hydroxyphenyl) acrylamide, N-(3-hydroxyphenyl) acrylamide, N-(4-hydroxyphenyl) acrylamide, N-(2- hydroxy-phenyl) methacrylamide, N-(3-hydroxyphenyl) methacrylamide, N-(4-hydroxyphenyl) methacrylamide, o-hydroxyphenyl acrylate, m-hydroxyphenyl acrylate, p-hydroxy-phenyl acrylate, o-hydroxyphenyl methacrylate, m-hydroxyphenyl methacrylate, p-hydroxyphenyl methacrylate, o-hydroxystyrene, m-hydroxystyrene, p-hydroxy-styrene, 2-(2-hydroxyphenyl) ethyl acrylate, 2-(3-hydroxyphenyl) ethyl acrylate, 2-(4-hydroxyphenyl) ethyl acrylate, 2-(2-hydroxyphenyl) ethyl methacrylate, 2-(3-hydroxyphenyl) ethyl methacrylate and 2-(4-hydroxyphenyl) ethyl methacrylate.

The foregoing alkali-soluble high molecular weight compound carrying a phenolic group preferably has a weight-average molecular weight ranging from $5.0 \times 10^2$ to $2.0 \times 10^5$ and a number-average molecular weight ranging from $2.0 \times 10^2$ to $1.0 \times 10^5$ from the viewpoint of the image-forming ability.

Moreover, the alkali-soluble high molecular weight compounds carrying phenolic groups may be used alone or in any combination of at least two of them. When they are used in combination, they may be used in combination with polycondensates of phenols carrying an alkyl group having 3 to 8 carbon atoms as a substituent with formaldehyde such as polycondensates of t-butyl phenol with formaldehyde and those of octyl phenol with formaldehyde, as disclosed in U.S. Pat. No. 4,123,279.

These polycondensates likewise preferably have a weight-average molecular weight ranging from $5.0 \times 10^2$ to $2.0 \times 10^5$ and a number-average molecular weight ranging from $2.0 \times 10^2$ to $1.0 \times 10^5$.

(2) Examples of alkali-soluble high molecular weight compounds carrying sulfonamide groups include polymers mainly comprising compounds carrying sulfonamide groups as monomer units such as homopolymers of such monomers and copolymers obtained by copolymerizing the monomers with other polymerizable monomers.

Such a polymerizable monomer carrying a sulfonamide group may be ones consisting of low molecular weight compounds each having at least one sulfonamide group: —SO$_2$—NH— in which at least one hydrogen atom is bonded to the nitrogen atom and at least one polymerizable unsaturated bond in the molecule. Preferred are low molecular weight compounds each having an acryloyl group, an aryl group or a vinyloxy group and a substituted or mono-substituted aminosulfonyl group or a substituted sulfonylimino group, among others.

The foregoing low molecular weight compound may be, for instance, compounds represented by the following general formulas (a) to (e), but the present invention is not restricted to these specific compounds:

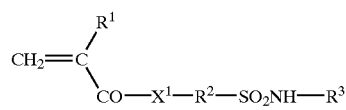

(a)

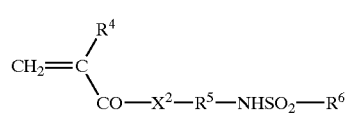

(b)

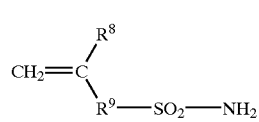

(c)

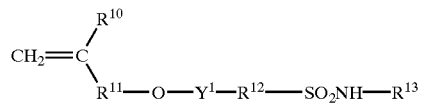

(d)

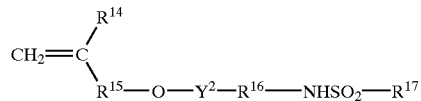

(e)

In the foregoing general formulas, $X^1$ and $X^2$ each independently represents an oxygen atom or a group: $NR^7$. The substituents $R^1$ and $R^4$ each independently represents a hydrogen atom or $CH_3$. $R^2$, $R^5$, $R^9$, $R^{12}$ and $R^{16}$ each independently represents an alkylene group having 1 to 12 carbon atoms, a cycloalkylene group, an arylene group or an aralkylene group, which may have a substituent. The substituents $R^3$, $R^7$ and $R^{13}$ each independently represents a hydrogen atom or an alkyl group having 1 to 12 carbon atoms, a cycloalkyl group, an aryl group or an aralkyl group, which may have a substituent. The substituents $R^6$ and $R^{17}$ each independently represents an alkyl group having 1 to 12 carbon atoms, a cycloalkyl group, an aryl group or an aralkyl group, which may have a substituent. The substituents $R^8$, $R^{10}$ and $R^{14}$ each independently represents a hydrogen atom or $CH_3$. $R^{11}$ and $R^{15}$ each independently represents a single bond or an alkylene group having 1 to 12 carbon atoms, a cycloalkylene group, an arylene group or an aralkylene group, which may have a substituent. $Y^1$ and $Y^2$ each independently represents a single bond or CO.

Among them, preferably used herein are, for instance, m-aminosulfonylphenyl methacrylate, N-(p-aminosulfonylphenyl) methacrylamide and N-(p-aminosulfonyl-phenyl) acrylamide.

(3) The alkali-soluble high molecular weight compound carrying active imide group may be, for instance, polymers comprising compounds carrying active imide groups as principal monomer units.

Examples of the alkali-soluble high molecular weight compound carrying active imide group may be, for instance, high molecular weight compounds such as those prepared by homopolymerizing monomers consisting of low molecular weight compounds each having, in the molecule, at least one active imide group represented by the formula: —CO—NH—SO$_2$— and at least one polymerizable unsaturated bond or those obtained by copolymerizing such monomers with other polymerizable monomers.

Specific examples of such compounds suitably used herein are N-(p-toluene-sulfonyl) methacrylamide and N-(p-toluenesulfonyl) acrylamide.

Examples of such compounds suitably used herein also include, in addition to those listed above, polymeric compounds obtained by polymerizing at least two polymerizable monomers selected from the group consisting of the foregoing polymerizable monomers each carrying a phenol group, polymerizable monomers each carrying a sulfonamide group and polymerizable monomers each carrying an active imide group, or polymeric compounds obtained by copolymerizing these at least two polymerizable monomers with other polymerizable monomers.

When copolymerizing a polymerizable monomer (M1) carrying a phenol group, a polymerizable monomer (M2) carrying a sulfonamide group and/or a polymerizable monomer (M3) carrying an active imide group, the mixing ratio of these monomers (M1:M2 and/or M3, by weight) preferably ranges from 50:50 to 5:95 and more preferably 40:60 to 10:90.

In case where the alkali-soluble polymeric compound is a copolymer comprising repeating units of a monomer carrying a group selected from the foregoing acidic groups (1) to (3) and repeating units of another polymerizable monomer, the resulting copolymer preferably comprises not less than 10 mole % and more preferably not less than 20 mole % of the repeating units derived from the monomer carrying a group selected from the foregoing acidic groups (1) to (3).

This is because if the content of the repeating units derived from the foregoing monomer is less than 10 mole %, the resulting polymeric compound does not have any sufficient solubility in an alkaline solution and this accordingly results in the reduction of the developing latitude.

The foregoing copolymer may be prepared by any conventionally known method such as graft copolymerization, block copolymerization and random copolymerization.

Other polymerizable monomers, which are copolymerized with the monomer carrying a group selected from the foregoing acidic groups (1) to (3) may, for instance, be those listed bellow as monomers (a) to (l), but the present invention is not restricted to these specific ones at all:

(a) Acrylic acid esters and methacrylic acid esters each carrying an aliphatic hydroxyl group such as 2-hydroxyethyl acrylate or 2-hydroxyethyl methacrylate;
(b) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;
(c) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;
(d) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;
(e) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;
(f) Vinyl esters such as vinyl acetate, vinyl chloroacetate, vinyl butyrate and vinyl benzoate;
(g) Styrenes such as styrene, α-methyl styrene, methyl styrene and chloromethyl styrene;
(h) Vinyl ketones such as methyl vinyl ketone, ethyl vinyl ketone, propyl vinyl ketone and phenyl vinyl ketone;
(i) Olefins such as ethylene, propylene, isobutylene, butadiene and isoprene;
(j) N-Vinyl pyrrolidone, N-vinyl carbazole, 4-vinyl pyridine, acrylonitrile, methacrylonitrile or the like;
(k) Unsaturated imides such as maleimide, N-acryloyl acrylamide, N-acetyl methacrylamide, N-propionyl methacrylamide and N-(p-chlorobenzoyl) methacrylamide; and
(l) Unsaturated carboxylic acids such as acrylic acid, methacrylic acid, maleic anhydride and itaconic acid.

The foregoing alkali-soluble polymeric compound preferably has a weight-average molecular weight of not less than 2000, a number-average molecular weight of not less than 500, more preferably a weight-average molecular weight ranging from 5000 to 300,000, a number-average molecular weight ranging from 800 to 250,000 and a degree of dispersion (weight-average molecular weight/number-average molecular weight) ranging from 1.1 to 10, from the viewpoint of the film strength no matter what it is a homopolymers or a copolymer.

Moreover, in case where the alkali-soluble polymeric compound is, for instance, a phenol-formaldehyde resin or a cresol-aldehyde resin, the polymeric compound preferably has a weight-average molecular weight ranging from 500 to 20000 and a number-average molecular weight ranging from 200 to 10000.

The content of the alkali-soluble polymeric compound in the image-forming layer preferably ranges from 30 to 99% by weight, more preferably 40 to 95% by weight and most preferably 50 to 90% by weight on the basis of the total solid content, by weight, of the image-forming layer.

This is because if the content of the polymeric compound is less than 30% by weight, the resulting image-forming layer often has reduced durability, while if it exceeds 99% by weight, the sensitivity and durability of the layer may sometimes be reduced.

In addition, the foregoing polymeric compounds may be used alone or in any combination.

(C) The compound, which may be compatible with the alkali-soluble high molecular weight compound and the alkali-soluble resin to thus reduce the solubility of said compounds in an alkaline aqueous solution and whose effect of reducing the solubility of the polymeric compound is lowered through heating The component (C) means a compound, which has good compatibility with the compounds (B1) and (B2) because of the action of the functional group capable of forming hydrogen bond present in the molecule, can form a coating liquid for a uniform image-forming layer and has a function (solubility-controlling action) of controlling the alkali-solubility of the compounds (B1) and (B2) due to the interaction thereof with the polymeric compound.

Moreover, the component (C) loses the solubility-controlling effect on the components (B1) and (B2) through heating. When the IR-absorbing agent is a compound, which can, in itself, be decomposed by heating, however, the effect of controlling the solubility of the alkali-soluble polymeric components (B1) and (B2) cannot sufficiently be reduced unless an energy sufficient for the decomposition thereof is provided by establishing a variety of conditions such as the laser output and exposure time period and the sensitivity of the resulting image-forming layer may be reduced. For this reason, the component (C) preferably has a thermal decomposition temperature of not less than 150° C.

The component (C) can appropriately be selected from compounds capable of undergoing interaction with the foregoing components (B1) and (B2), such as sulfone compounds, ammonium salts, phosphonium salts and amide compounds, while taking into consideration the interaction thereof with the alkali-soluble polymeric compounds (B1) and (B2).

In particular, when a novolak resin is, for instance, used alone as the component (B2), "component (A+C)" as will be detailed below is preferred, with the following substances such as Cyanine Dye A being more preferred. The component (A+C) will be detailed below.

In general, the mixing ratio of the component (C) to the alkali-soluble polymeric compounds (B1) and (B2) (C/(B1+B2), by weight) preferably ranges from 1/99 to 25/75.

If the foregoing mixing ratio is less than 1/99 or the amount of the component (C) is too small, the component (C) insufficiently interacts with the alkali-soluble polymeric compounds (B1) and (B2) and cannot reduce the solubility in an alkaline solution. This accordingly makes it difficult to form good images. On the other hand, if the mixing ratio exceeds 25/75 or the amount of the component (C) is too large, the component (C) unreasonably interacts with the alkali-soluble polymeric compounds (B1) and (B2) and the sensitivity of the resulting image-forming layer is often reduced significantly.

The Component (A+C)

A compound (the component (A+C)) possessing the characteristic properties of the both components (A) and (C) may be substituted for the foregoing component (A) and the component (C).

The foregoing component (A+C) is a basic dye, which can absorb light rays to thus generate heat (characteristic properties of the component (A)), which has an absorption region falling within the wavelength range of from 700 to 1200 nm and which can be well compatible with the alkali-soluble polymeric compounds (B1) and (B2).

The component (A+C) has, in the molecule, a group capable of interacting with the alkali-soluble polymeric compound (characteristic properties of the component (C)) such as an ammonium group or an iminium group and therefore, the component can undergo the interaction with the alkali-soluble polymeric compound to thus control the alkali-solubility thereof.

Examples of the foregoing components (A+C) may be those represented by the following general formula (Z):

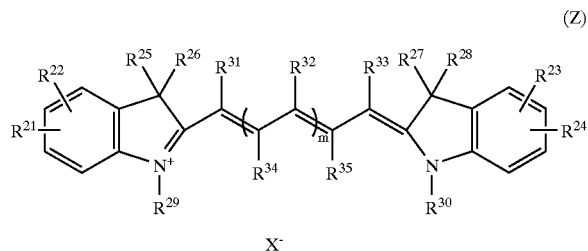

(Z)

In the foregoing general formula (Z), the substituents $R^{21}$ to $R^{24}$ independently represent a hydrogen atom or an alkyl group having 1 to 12 carbon atoms, an alkenyl group, an alkoxy group, a cycloalkyl group or an aryl group, which may have a substituent, provided that $R^{21}$ and $R^{22}$ or $R^{23}$ and $R^{24}$ may be bonded together to form a ring structure.

Specific examples of the substituents $R^{21}$ to $R^{24}$ are a hydrogen atom, a methyl group, an ethyl group, a phenyl group, a dodecyl group, a naphthyl group, a vinyl group, an allyl group and a cyclohexyl group and these groups may have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In the foregoing general formula, the substituents $R^{25}$ to $R^{30}$ each independently represents an alkyl group having 1 to 12 carbon atoms, which may have a substituent and specific examples thereof are methyl, ethyl, phenyl, dodecyl, naphthyl, vinyl, allyl and cyclohexyl groups and these groups may have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In the foregoing general formula, the substituents $R^{31}$ to $R^{33}$ may independently represent a hydrogen atom, a halogen atom, or an alkyl group having 1 to 8 carbon atoms, which may further have a substituent, provided that the substituent $R^{32}$ may be bonded to the substituent $R^{31}$ or $R^{33}$ to form a ring structure and that in case of m>2, a plurality of the substituents $R^{32}$ may be bonded together to form a ring structure.

Specific examples of the foregoing substituents $R^{31}$ to $R^{33}$ are a chlorine atom, a cyclohexyl group or, a cyclopentyl ring or a cyclohexyl ring formed through coupling of the plurality of the substituents $R^{32}$. These groups may further have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In addition, m is an integer falling within the range of from 1 to 8 and preferably 1 to 3.

In the foregoing general formula, substituents $R^{34}$ to $R^{35}$ may independently represent a hydrogen atom, a halogen atom, or an alkyl group having 1 to 8 carbon atoms, which may further have a substituent, provided that the substituent $R^{34}$ may be bonded to the substituent $R^{35}$ to form a ring structure and that in case of m>2, a plurality of the substituents $R^{34}$ may be bonded together to form a ring structure.

Specific examples of the foregoing substituents $R^{34}$ to $R^{35}$ are a chlorine atom, a cyclohexyl group or, a cyclopentyl ring or a cyclohexyl ring formed through coupling of the plurality of the substituents $R^{34}$. These groups may further have a substituent. In this respect, examples of such substituents are halogen atoms, a carbonyl group, a nitro group, a nitrile group, a sulfonyl group, a carboxyl group, a carboxylic acid ester residue and a sulfonic acid ester residue.

In addition, m is an integer falling within the range of from 1 to 8 and preferably 1 to 3.

In the foregoing formula, $X^-$ represents an anion such as a perchlorate ion, a tetrafluoroborate ion, a hexafluorophosphate ion, a triisopropylnaphthalene sulfonate ion, a 5-nitro-O-toluenesulfonate ion, a 5-sulfosalicylate ion, a 2,5-dimethylbenzene-sulfonate ion, a 2,4,6-trimethylbenzenesulfonate ion, a 2-nitrobenzenesulfonate ion, a 3-chlorobenzenesulfonate ion, a 3-bromobenzenesulfonate ion, a 2-fluorocapryl-naphthalenesulfonate ion, a dodecylbenzenesulfonate ion, a 1-naphthol-5-sulfonate ion, a 2-methoxy-4-hydroxy-5-benzoyl-benzenesulfonate ion and a p-toluenesulfonate ion.

Among these ions, preferred are a hexafluorophosphate ion, and alkyl aromatic sulfonate ions such as a triisopropylnaphthalene sulfonate ion and a 2,5-dimethylbenzenesulfonate ion.

The compound represented by the foregoing general formula (Z) is in general a compound called cyanine dye and more specifically, the following compounds are preferably used in the invention, but the present invention is not restricted to these specific compounds.

Cyanine Dye A

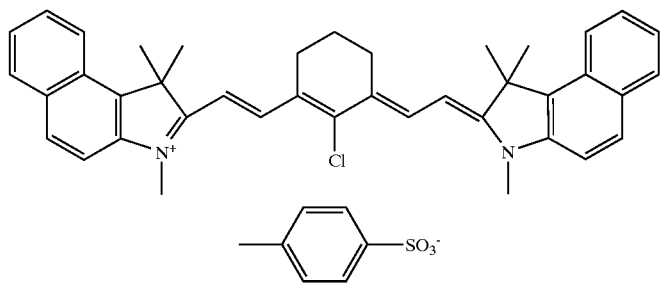

Cyanine Dye B

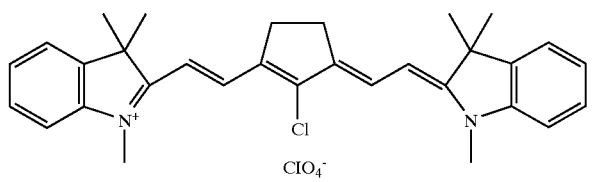

Cyanine Dye C

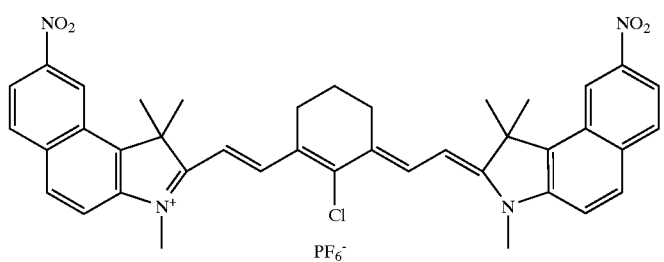

Cyanine Dye D

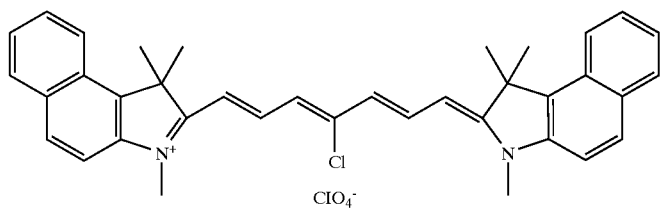

Cyanine Dye E

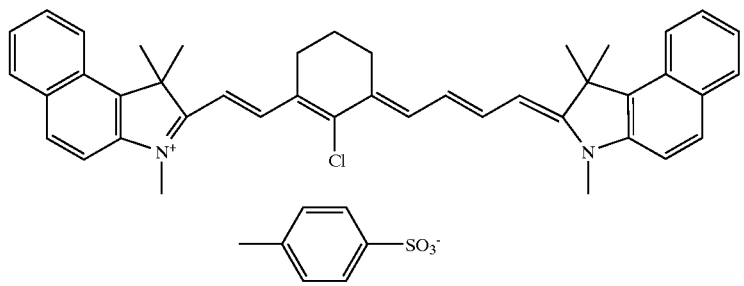

In case where the foregoing component (A+C) possessing the characteristic properties of the foregoing components (A) and (C) is substituted for these components (A) and (C), the ratio of the amount of the component (A+C) to that of the components (B1) and (B2) [(A+C)/((B1)+(B2)) by weight] preferably ranges from 1/99 to 30/70 and more preferably 1/99 to 25/75.

(D) The Cyclic Acid Anhydride

In the lithographic printing plate precursor, a cyclic acid anhydride may be further used. The cyclic acid anhydride has, within the structure thereof, a bond conjugated with the carbonyl group of a carboxylic acid anhydride, can control the decomposition rate of the carboxylic anhydride through the improvement of the stability of the carbonyl group and can generate an acid at an appropriate rate during storage and with the elapse of time. For this reason, the cyclic acid anhydride can control the deterioration of the developing ability of the lithographic printing plate precursor thus permits the stable maintenance of the developing ability thereof over a long period of time.

Examples of the foregoing cyclic acid anhydrides are compounds represented by the following general formula (XI) or (XII):

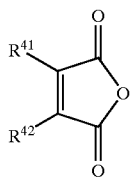
(XI)

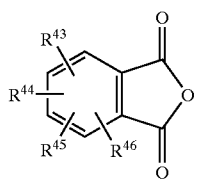
(XII)

In the general formula (XI), the substituents $R^{41}$ and $R^{42}$ independently represent a hydrogen atom, or an alkyl group having 1 to 12 carbon atoms, an alkenyl group, an alkoxy group, a cycloalkyl group, an aryl group, a carbonyl group, a carboxyl group or a carboxylic acid ester residue, which may have a substituent. In this respect, the substituents $R^{41}$ and $R^{42}$ may be bonded together to form a ring structure.

Examples of the foregoing substituents $R^{41}$ and $R^{42}$ suitably used herein are a hydrogen atom, or an unsubstituted alkyl group having 1 to 12 carbon atoms, an aryl group, an alkenyl group or a cycloalkyl group, and specific examples thereof are a hydrogen atom or a methyl, ethyl, phenyl, dodecyl, naphthyl, vinyl, allyl or cyclohexyl group, and these groups may further have a substituent.

In case where $R^{41}$ and $R^{42}$ are bonded together to form a ring structure, examples of such cyclic groups are phenylene, naphthylene, cyclohexene and cyclopentene groups.

Examples of the foregoing substituents are halogen atoms, a hydroxyl group, a carbonyl group, a sulfonic acid ester residue, a nitro group and a nitrile group.

In the foregoing general formula (XII), the substituents $R^{43}$ to $R^{46}$ independently represent a hydrogen atom, a hydroxyl group, a halogen atom such as a chlorine atom, a nitro group, a nitrile group, or an alkyl group having 1 to 12 carbon atoms, an alkenyl group, an alkoxy group, a cycloalkyl group, an aryl group, a carbonyl group, a carboxyl group or a carboxylic acid ester residue, which may have a substituent.

Examples of the foregoing substituents $R^{43}$ to $R^{46}$ suitably used herein are a hydrogen atom, halogen atoms, alkyl groups having 1 to 12 carbon atoms, alkenyl groups and aryl groups having 6 to 12 carbon atoms and specific examples thereof are methyl, vinyl, phenyl and allyl groups. These groups may further have substituents.

Examples of such substituents are halogen atoms, hydroxyl group, carbonyl group, sulfonic acid ester residues, nitro group, nitrile group and carboxyl group.

Examples of the cyclic acid anhydrides suitably used herein are phthalic acid anhydride, 3,4,5,6-tetrahydrophthalic acid anhydride, tetrachlorophthalic acid anhydride, 3-hydroxyphthalic acid anhydride, 3-methylphthalic acid anhydride, 3-phenylphthalic acid anhydride, trimellitic acid anhydride, pyromellitic acid anhydride, maleic acid anhydride, phenyl maleic acid anhydride, dimethyl maleic acid anhydride, dichloromaleic acid anhydride and chloromaleic acid anhydride.

The content of the cyclic acid anhydride present in the image-forming layer preferably ranges from 0.5 to 20% by weight, more preferably 1 to 15% by weight and most preferably 1 to 10% by weight on the basis of the total solid content, by weight, of the image-forming layer. If the content of the cyclic acid anhydride is less than 0.5% by weight, the effect of maintaining the developing ability is sometimes insufficient, while if the content thereof exceeds 20% by weight, the resulting image-forming layer cannot often form any image.

The following are components for constituting the recording layer for a negative lithographic printing plate.

(E) The Compound Capable of Generating Acid Through Heating

If the image-forming material is a negative type one, a compound (hereunder referred to as "acid-generating agent") capable of generating an acid upon heating is simultaneously used. This acid-generating agent is decomposed when it is heated to a temperature of not less than 100° C. to thus increase the amount of an acid-generating compound. The acid thus generated is preferably a strong acid having a pKa value of not more than 2 such as sulfonic acid or hydrochloric acid.

Examples of such acid-generating agents are preferably onium salts such as iodonium salts, sulfonium salts, phosphonium salts and diazonium salts. Specific examples thereof are compounds disclosed in, for instance, U.S. Pat. No. 4,708,925 and Japanese Un-Examined Patent Publication No. Hei 7-20629, with iodonium salts, sulfonium salts and diazonium salts, whose counterions are sulfonate ions, among others.

Examples of the foregoing diazonium salts suitably used herein are diazonium salt compounds disclosed in U.S. Pat. No. 3,867,147, diazonium compounds disclosed in U.S. Pat. No. 2,632,703 and diazo resins such as those disclosed in Japanese Un-Examined Patent Publication Nos. Hei 1-102456 and Hei 1-102457.

Diazonium salts preferably used herein also include benzyl sulfonates disclosed in U.S. Pat. Nos. 5,135,838 and 5,200,544, and active sulfonic acid esters and disulfonyl compounds disclosed in Japanese Un-Examined Patent Publication Nos. Hei 2-100054, Hei 2-100055 and Hei 8-9444. Moreover, preferred also include haloalkyl-substituted S-triazines disclosed in Japanese Un-Examined Patent Publication No. Hei 7-271029.

The amount of the foregoing acid-generating agent to be incorporated preferably ranges from 0.01 to 50% by weight, more preferably 0.1 to 40% by weight and most preferably 0.5 to 30% by weight on the basis of the total solid content, by weight, of the image-forming layer.

(F) Crosslinking Agents Capable of Undergoing Crosslinking by the Action of Acids In case where the lithographic printing plate precursor is a negative type one, a crosslinking agent capable of causing crosslinking by the action of an acid (hereunder simply referred to as "crosslinking agent") is used in combination.

Examples of the foregoing crosslinking agents include those listed below:

(i) Aromatic compounds substituted with an alkoxymethyl or hydroxymethyl group;
(ii) Compounds having an N-hydroxymethyl, N-alkoxymethyl or N-acyloxymethyl group; and
(iii) Epoxy compounds.

Examples thereof also include those disclosed in Japanese Un-Examined Patent Publication No. Hei 11-254850 and phenol derivatives.

The amount of the crosslinking agent to be added to the image-forming layer preferably ranges from 5 to 80% by weight, more preferably 10 to 75% by weight and most preferably 20 to 70% by weight on the basis of the total solid content, by weight, of the image-forming layer.

When the foregoing phenol derivative is used as a crosslinking agent, the amount of the phenol derivative to be incorporated into the image-forming layer preferably ranges from 5 to 70% by weight and more preferably 10 to 50% by weight on the basis of the total solid content, by weight, of the image-forming layer.

The details of the foregoing various kinds of compounds are disclosed in Japanese Un-Examined Patent Publication No. 2000-267265.

Other Components

Moreover, a variety of additives may, if necessary, be added to the image-forming layer of a lithographic printing plate precursor to which the alkaline developing liquid of the invention is applied.

For instance, known additives such as phenols, organic acids and sulfonyl compounds may simultaneously be used in order to improve the sensitivity of the image-forming layer.

Examples of phenols are bisphenol A, p-nitrophenol, p-ethoxyphenol, 2,4,4'-tri-hydroxybenzophenone, 2,3,4-trihydroxybenzophenone, 4-hydroxybenzophenone, 4,4',4''-trihydroxy-triphenyl methane and 4,4',3'',4''-tetrahydroxy-3,5,3',5'-tetramethyl-triphenyl methane.

Examples of the foregoing organic acids are those disclosed in, for instance, Japanese Un-Examined Patent Publication Nos. Sho 60-88942 and Hei 2-96755 such as sulfonic acids, sulfinic acids, alkyl sulfuric acids, phosphonic acids, phosphoric acid esters and carboxylic acids and more specifically, they include, for instance, p-toluenesulfonic acid, dodecylbenzenesulfonic acid, p-toluenesulfinic acid, ethyl sulfuric acid, phenyl phosphonic acid, phenyl phosphinic acid, phenyl phosphate, diphenyl phosphate, benzoic acid, isophthalic acid, adipic acid, p-toluylic acid, 3,4-dimethoxy benzoic acid, phthalic acid, terephthalic acid, 4-cyclohexene-2,2-dicarboxylic acid, erucic acid, lauric acid, n-undecanoic acid and ascorbic acid.

As the sulfonyl compounds, there may be listed, for instance, bishydroxyphenyl sulfone, methylphenyl sulfone and diphenyl disulfone.

The amount of the foregoing additional additives such as phenols, organic acids or sulfonyl compounds to be incorporated into the image-forming layer preferably ranges from 0.05 to 20% by weight, more preferably 0.1 to 15% by weight and most preferably 0.1 to 10% by weight based on the total solid content, by weight, of the image-forming layer.

It is also possible to add, to the image-forming layer, a nonionic surfactant such as those disclosed in Japanese Un-Examined Patent Publication Nos. Sho 62-251740 and Hei 3-208514 and/or an amphoteric surfactant such as those disclosed in Japanese Un-Examined Patent Publication Nos. Sho 59-121044 and Hei 4-13149, siloxane compounds such as those disclosed in EP 950517, and copolymers of fluorine-containing monomers such as those disclosed in Japanese Un-Examined Patent Publication No. Hei 11-288093 in order to improve the stability of processability to developing conditions.

Examples of such nonionic surfactants are sorbitan tristearate, sorbitan monopalmitate, sorbitan trioleate, stearic acid monoglyceride and polyoxyethylene nonyl phenyl ether. Examples of amphotelic surfactants are alkyl-di(aminoethyl) glycine, alkyl polyaminoethyl glycine hydrochloride, 2-alkyl-N-carboxyethyl-N-hydroxyethyl imidazolinium betaine and N-tetradecyl-N,N-betaine type ones (such as Amogen K available from Dai-Ichi Kogyo (K.K.)).

Examples of the siloxane compounds are preferably block copolymers of dimethyl siloxane and polyalkylene oxide, and specific examples thereof include DBE-224, DBE-621, DBE-712, DBP-732 and DBP-534 manufactured by Chisso Corporation, and polyalkylene oxide-modified silicones such as Tego Glide 100 manufactured by Tego Company (Germany) and the like.

The amount of the foregoing surfactant to be incorporated into the image-forming layer preferably ranges from 0.05 to 15% by weight and more preferably 0.1 to 5% by weight on the basis of the total solid content, by weight, of the image-forming layer.

It is also possible to add, to the foregoing image-forming layer, an agent for obtaining a visible image immediately after heating through imagewise exposure (hereunder referred to as "printing-out agent") and/or a dye or a pigment as an image-coloring agent.

As the printing-out agent, there may be used, for instance, a combination of a compound capable of generating an acid upon heating through exposure and an organic dye capable of forming a salt with the acid-generating compound.

Specific examples thereof include a combination of an o-naphthoquinone-diazide-4-sulfonic acid halogenide with a salt-forming organic dye disclosed in Japanese Un-Examined Patent Publication Nos. Sho 50-36209, Sho 53-8128 and a combination of a trihalomethyl compound with a salt-forming organic dye disclosed in Japanese Un-Examined Patent Publication Nos. Sho 53-36223, Sho 54-74728, Sho 60-3626, Sho 61-143748, Sho 61-151644 and Sho 63-58440.

The foregoing trihalomethyl compound may be, for instance, oxazole compounds and triazines compounds and they are both excellent in stability with time and can provide clear printed out images.

The foregoing image-coloring agent usable herein may be, for instance, the aforementioned salt-forming organic dyes as well as other dyes and preferably used herein include, for instance, oil-soluble dyes and basic dyes.

Specific examples thereof are Oil Yellow #101, Oil Yellow #103, Oil Pink #312, Oil Green BG, Oil Blue BOS, Oil Blue #603, Oil Black BY, Oil Black BS, Oil Black T-505 (all of these coloring agents are available from ORIENT Chemical Industries, Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015). Moreover, dyes disclosed in Japanese Un-Examined Patent Publication No. Sho 62-293247 are particularly preferably used in the present invention The amount of the foregoing various kinds of dyes to be added to the image-forming layer preferably ranges from 0.01 to 10% by weight and more preferably 0.1 to 3% by weight on the basis of the total solid content, by weight, of the image-forming layer.

A plasticizer may likewise be added, if necessary, to the image-forming layer in order to impart flexibility to the resulting coated film.

Examples of such plasticizers are butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers or polymers of acrylic acid or methacrylic acid.

Moreover, the image-forming layer may, if necessary, comprise a variety of additives listed below.

For instance, onium salts, o-quinonediazide compounds, aromatic sulfone compounds and aromatic sulfonic acid ester compounds may simultaneously be used, these compounds being thermally decomposable and capable of substantially reducing the solubility of the alkali-soluble polymeric compound when it is not thermally decomposed. The addition of the compound is preferred to improve the ability of inhibiting any dissolution of the image area in a developer.

Examples of the foregoing onium salts are diazonium salts, ammonium salts, phosphonium salts, iodonium salts, sulfonium salts, selenonium salts and arsonium salts.

Among these, there may specifically be listed, for instance, diazonium salts disclosed in S. I. Schlesinger, Photogr. Sci. Eng., 1974, 18:387, T. S. Bal et al., Polymer, 1980, 21:423 and Japanese Un-Examined Patent Publication No. Sho 5-158230; ammonium salts disclosed in U.S. Pat. Nos. 4,069,055 and 4,069,056 and Japanese Un-Examined Patent Publication No. Hei 3-140140; phosphonium salts disclosed in D. C. Necker et al., Macromolecules, 1984, 17:2468, C. S. Wen et al., The Proc. Conf. Rad. Curing ASIA, p478 Tokyo, October (1988) and U.S. Pat. Nos. 4,069,055 and 4,069,056; iodonium salts disclosed in J. V. Crivello et al., Macromolecules, 1977, 10(6), p. 1307, Chem. & Eng. News, Nov. 28, p.31(1988), European Patent No. 104,143, U.S. Pat. Nos. 339,049 and 410,201 and Japanese Un-Examined Patent Publication Nos. Hei 2-150848 and Hei 2-296514; sulfonium salts disclosed in J. V. Crivello et al., Polymer J., 1985, 17:73, J. V. Crivello et al., J. Org. Chem., 1978, 43:3055, W. R. Watt et al., J. Polymer Sci., Polymer Chem. Ed., 1984, 22:1789, J. V. Crivello et al., Polymer Bull., 1985, 14:279, J. V. Crivello et al., Macromolecules, 1981, 14(5):1141, J. V. Crivello et al., J. Polymer Sci., Polymer Chem. Ed., 1979, 17:2877, European Patent Nos. 370,693, 233,567, 297,443 and 297,442, U.S. Pat. Nos. 4,933,377, 3,902,114, 410,201, 399,049, 4,760,013, 4,734,444 and 2,833,827, and German Patent Nos. 2,904,626, 3,604,580 and 3,604,581; selenonium salts disclosed in J. V. Crivello et al., Macromolecules, 1977, 10(6), p. 1307 and J. V. Crivello et al., J. Polymer Sci., Polymer Chem. Ed., 1979, 17:1047; and arsonium salts disclosed in C. S. Wen et al., The Proc. Conf. Rad. Curing ASIA, p478 Tokyo, October (1988).

Among the onium salts listed above, preferred are diazonium salts, with those disclosed in Japanese Un-Examined Patent Publication No. Hei 5-158230 being more preferred.

Counter ions for these onium salts may be, for instance, tetrafluoroborate, hexafluorophosphate, triisopropylnaphthalene sulfonate, 5-nitro-o-toluene sulfonate, 5-sulfosalicylate, 2,5-dimethylbenzene sulfonate, 2,4,6-trimethylbenzene sulfonate, 2-nitrobenzene sulfonate, 3-chlorobenzene sulfonate, 3-bromobenzene sulfonate, 2-fluorocaprylnaphthalene sulfonate, dodecylbenzene sulfonate, 1-naphthol-5-sulfonate, 2-methoxy-4-hydroxy-5-benzoyl-benzenesulfonate and p-toluenesulfonate ions.

Among these, preferred are hexafluorophosphate, and alkyl aromatic sulfonate such as triisopropylnaphthalene sulfonate and 2,5-dimethylbenzene sulfonate ions.

Examples of the foregoing o-quinonediazide compounds are those having at least one o-quinonediazide group and capable of increasing the alkali-solubility through thermal decomposition and the compounds may have a variety of structures.

The o-quinonediazide loses the ability of inhibiting the dissolution of a binder and the o-quinonediazide per se is converted into an alkali-soluble substance, through thermal decomposition. The o-quinonediazide is involved in the improvement of the solubility of the lithographic printing plate precursor.

Examples of such o-quinonediazide compounds usable herein are those disclosed in J. Coaser, "Light-Sensitive Systems", John Wiley & Sons Inc., pp. 339–352 and preferred are sulfonic acid esters or sulfonic acid amides reacted with a variety of aromatic polyhydroxy compounds or aromatic amino compounds among others.

In addition, preferably used herein also include benzoquinone-(1,2)-diazide sulfonic acid chloride disclosed in Japanese Un-Examined Patent Publication No. Sho 43-28403 or esters of benzoquinone-(1,2)-diazide sulfonic acid chloride or naphthoquinone-(1,2)-diazide-5-sulfonic acid chloride disclosed in U.S. Pat. Nos. 3,046,120 and 3,188,210.

Furthermore, also preferred are esters of naphthoquinone-(1,2)-diazide-4-sulfonic acid chloride with phenol-formaldehyde resins or cresol-formaldehyde resins and esters of naphthoquinone-(1,2)-diazide-4-sulfonic acid chloride with pyrogallol-acetone resins.

In addition, effectively used herein also include those disclosed in, for instance, Japanese Un-Examined Patent Publication Nos. Sho 47-5303, Sho 48-63802, Sho 48-63803, Sho 48-96575, Sho 49-38701 and Sho 48-13354, Japanese Examined Patent Publication Nos. Sho 41-11222, Sho 45-9610 and Sho 49-17481, U.S. Pat. Nos. 2,797,213, 3,454,400, 3,544,323, 3,573,917, 3,674,495 and 3,785,825, G.B. Patent Nos. 1,227,602, 1,251,345, 1,267,005, 1,329, 888 and 1,330,932 and German Patent No. 854,890.

These compounds may be used alone or a mixture comprising a combination of several compounds.

The amount of these optional additives such as onium salts, o-quinonediazide compounds and aromatic sulfonic acid esters to be incorporated into the image-forming layer preferably ranges from 0.1 to 50% by weight, more preferably 0.5 to 30% by weight and most preferably 0.5 to 20% by weight on the basis of the total solid content, by weight, of the image-forming layer.

Further, in order to enhance the discrimination of images and the resistivity against scratches on the surface of image-forming layer, it is preferable to incorporate a polymer such as disclosed in Japanese Un-Examined Patent Publication No. 2000-187318, which comprises as a polymerizable component, a (meth)acrylate monomer which has 2 or 3 of perfluoroalkyl groups in the molecule, and said perfluoroalkyl group has 3 to 20 carbon atoms, into the image-forming layer. The amount of the polymer preferably ranges from 0.1 to 10% by weight and more preferably from 0.5 to 5% by weight on the basis of the total solid content, by weight, of the image-forming layer.

Furthermore, in order to impart the resistivity against scratches to the surface of image-forming layer, it may be possible to incorporate a compound which is capable to reducing a static coefficient of friction into the image-forming layer. An example thereof includes a long-chain alkyl carboxylate as disclosed in U.S. Pat. No. 6,117,913. The amount thereof preferably ranges from 0.1 to 10% by weight and more preferably from 0.5 to 5% by weight on the basis of the total solid content, by weight, of the image-forming layer.

In addition, in order to control the solubility of the image-forming layer, the image-forming layer may further comprise various dissolution-suppressive agents. Examples of such dissolution-suppressive agent preferably used are disulfone compounds and sulfone compounds as disclosed in Japanese Un-Examined Patent Publication No.Hei 11-119418, and more specifically, 4,4'-bis-hydroxyphenylsulfone. The amount thereof preferably ranges from 0.05 to 20% by weight and more preferably from 0.5 to 10% by weight on the basis of the total solid content, by weight, of the image-forming layer.

As one example of a pre-sensitized plate for use in making a lithographic printing plate, to which the plate making method according to the present invention may be applied, there is a lithographic printing plate precursor which has an image-forming layer consisting of two-layered thermally-sensitive layer in a positive-type as disclosed, for example, in JP KOKAI No. 2002-182400. Namely, this positive-type thermally-sensitive layer is characterized in that it has a laminated structure, and comprises one layer referred to as a thermally-sensitive layer which is positioned near the surface (i.e. the surface to be light-exposed), and another layer referred to as a lower layer comprising an alkali-soluble high molecular weight compound, which is positioned near a substrate. Both of the thermally-sensitive layer and the lower layer, or one of them may comprise each of the above-mentioned compounds, (A) the IR-absorbing agent, (B1) an alkali-soluble high molecular weight compound having a carboxyl group, (B2) an alkali-soluble resin, (C) the compound, which may be compatible with the components (B1) and (B2) to thus reduce the solubility of the alkali-soluble high molecular weight compounds in an alkaline liquid developer and whose effect of reducing the solubility of the polymeric compound is lowered through heating, and other compounds.

As the alkali-soluble resin used in the lower layer, acrylic resins are preferable from the viewpoint of image formation during development processing, since acrylic resins are capable of retaining favorably solubility of the lower layer to an alkaline developer comprising as main components, an organic compound and a base which exhibit a buffer action. Further, preferred acrylic resins are those having a sulfonamide group. On the other hand, as the alkali-soluble resin used in the thermally-sensitive layer, resins having a phenolic hydroxyl group are preferable, since they generate strong hydrogen bonds at non-exposed areas, and at exposed areas, partial hydrogen bonds are easily eliminated. Further preferred are novolac resins.

The IR-absorbing agent may be incorporated into not only the thermally-sensitive layer but also the lower layer. By incorporating the IR-absorbing agent into the lower layer, the lower layer can serve as a thermally-sensitive layer. When the IR-absorbing agent is incorporated into the lower layer, said IR-absorbing agent may be the same as ones used in the thermally-sensitive layer, or may be different from each other.

Other additives may be added to merely the lower layer, or merely the thermally-sensitive layer, or both of them.

A lithographic printing plate precursor, which is developed using the alkaline liquid developer according to the method of the present invention, is in general prepared by dissolving the foregoing various kinds of components (the components (A) to (F) and other components) in a solvent to give a coating liquid for forming an image-forming layer including the above-mentioned two-layered image-forming layer and then applying the coating liquid onto a desired substrate.

Examples of such solvents are ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethylacetamide, N,N-dimethyl formamide, tetramethylurea, N-methyl pyrrolidone, dimethyl sulfoxide, sulfolane, α-butyrolactone, and toluene, but the present invention is not restricted to these specific examples. The foregoing solvents may be used alone or in any combination of at least two of them.

In case of the image-forming layer consisting of two-layered structure, it is preferable to select a solvent which exhibits a solvent power to the alkali-soluble compound used in the thermally-sensitive layer, said solvent power being different from a solvent power to the alkali-soluble compound used in the lower layer. Namely, in case that a coating solution for the lower layer is applied and then a coating solution for the thermally-sensitive layer is adjacently applied, when the solvent for the thermally-sensitive layer may dissolve the alkali-soluble compound used in the lower layer, it cannot be neglected to occur blending at the interface between the two layers, and then the two-layered structure will not be formed and in an extreme case, a uniform single layer may be formed. Accordingly, a solvent for use in applying the upper thermally-sensitive layer is preferably a bad solvent to the alkali-soluble compound used in the lower layer.

The total solid content of the foregoing various kinds of components (the components (A) to (F) and other components) in the solvent preferably falls within the range of from 1 to 50% by weight.

In general the dry coated amount (solid content) of the image-forming layer, which is formed by applying the foregoing coating liquid onto a substrate and then drying the coated layer preferably ranges from 0.5 to 5.0 g/m$^2$. In case of the image-forming layer consisting of two-layer structure, the coated and dried amount for the thermally-sensitive layer (an upper layer) preferably ranges from 0.05 to 1.0 g/m$^2$, and the coated and dried amount for the lower layer preferably ranges from 0.3 to 3.0 g/m$^2$. The smaller the coated amount of the coating liquid, the higher the apparent sensitivity of the resulting image-forming layer, but the film characteristic properties of the layer are lowered.

The coating liquid for forming an image-forming layer can be applied onto the surface of a substrate by a method selected from a variety of known methods such as bar coater coating, whirler coating, spray coating, curtain coating, dip coating, air knife coating, grade coating and roll coating.

A surfactant such as a fluorine-containing surfactant disclosed in Japanese Un-Examined Patent Publication No. Sho 62-170950 can be incorporated into the coating liquid for forming an image-forming layer in order to improve the coating characteristics of the liquid. The amount thereof to be added preferably ranges from 0.01 to 1% by weight and more preferably 0.05 to 0.5% by weight on the basis of the total solid content of the image-forming layer.

Substrate

The substrate to which the image-forming layer is applied may be, for instance, a pure aluminum plate, aluminum alloy plates, and plastic films that are laminated with aluminum or on which aluminum is vapor-deposited.

The surface of the aluminum plate is preferably subjected to a surface-treatment such as graining, immersion in an aqueous solution of, for instance, sodium silicate, potassium fluorozirconate or a phosphate, or anodization.

In addition, preferably used herein also include, for instance, an aluminum plate, which is subjected to a graining treatment and then to an immersion treatment using an aqueous sodium silicate solution, as disclosed in U.S. Pat. No. 2,714,066 and an aluminum plate, which is anodized and then immersed in an aqueous alkali metal silicate solution, as disclosed in Japanese Examined Patent Publication No. Sho 47-5125.

The foregoing anodization treatment is carried out by, for instance, passing an electric current through an electrolyte such as an aqueous or non-aqueous solution containing, for instance, an inorganic acid such as hydrochloric acid, sulfuric acid, phosphoric acid, chromic acid, nitric acid or boric acid, an organic acid such as oxalic acid or sulfamic acid or a salt thereof, wherein these aqueous and non-aqueous solutions may be used alone or in any combination, while using an aluminum plate as an anode.

It is also effective to use the silicate-electrodeposition disclosed in U.S. Pat. No. 3,658,662.

Moreover, useful substrates also include, for instance, those subjected to an electrolytic graining treatment and then the foregoing anodization treatment, such as those disclosed in U.S. Pat. No. 4,087,341, Japanese Examined Patent Publication No. Sho 46-27481 and Japanese Un-Examined Patent Publication No. Sho 52-30503.

Useful substrates also include, for instance, aluminum plates each subjected to, in order, surface-graining, chemical etching and anodization, as disclosed in U.S. Pat. No. 3,834,998.

The substrate is subjected to these surface-treatments for a variety of purposes, for instance, for making the surface of the substrate hydrophilic, for preventing the occurrence of any detrimental reaction between the substrate and the image-forming layer applied thereto and for improving the adhesion of the substrate surface to the image-forming layer.

A lithographic printing plate precursor can be prepared by applying an image-forming layer as a light-sensitive layer onto the surface of a desired substrate, but a primary layer may, if necessary, be formed on the substrate prior to the formation of the image-forming layer.

Such a primary layer may be formed from a variety of organic compounds, for instance, carboxymethyl cellulose, dextrin, gum Arabic, phosphonic acids carrying an amino group such as 2-aminoethyl phosphonic acid; organic phosphonic acids, which may have a substituent, such as phenyl phosphonic acid, naphthyl phosphonic acid, alkyl phosphonic acid, glycerophosphonic acid, methylenediphosphonic acid and ethylenediphosphonic acid; organic phosphoric acid, which may have a substituent, such as phenyl phosphoric acid, naphthyl phosphoric acid, alkyl phosphoric acid and glycerophosphoric acid; organic phosphinic acids, which may have a substituent, such as phenyl phosphinic acid, naphthyl phosphinic acid, alkyl phosphinic acid and glycerophosphinic acid; amino acids such as glycine and β-alanine; and hydrochlorides of amines having a hydroxyl group such as triethanolamine hydrochloride.

The foregoing organic compounds may be used alone or in any combination thereof In a preferred embodiment, the foregoing diazonium salt is applied onto the substrate to form such a primary layer.

An organic primary layer comprising at least one organic polymeric compound, which comprises repeating units represented by the following general formula (XIII) may preferably be used as the foregoing primary layer:

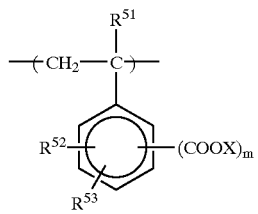

(XIII)

In the general formula (XIII), the substituent $R^{51}$ represents a hydrogen atom, a halogen atom or an alkyl group, the substituents $R^{52}$ and $R^{53}$ independently represent a hydrogen atom, a halogen atom, a hydroxyl group, an alkyl group, a substituted alkyl group, an aryl group, a substituted aryl group, $-OR^{54}$, $-COOR^{55}$, $-CONHR^{56}$, $-COR^{57}$ or $-CN$, the foregoing substituents $R^{52}$ and $R^{53}$ may be bonded together to form a ring structure. In this respect, the substituents $R^{54}$ to $R^{57}$ independently represent an alkyl group or an aryl group. X represents a hydrogen atom, a metal atom or $-NR^{58}R^{59}R^{60}R^{61}$, wherein the foregoing substituents $R^{58}$ to $R^{61}$ independently represent a hydrogen atom, an alkyl group, a substituted alkyl group, an aryl group or a substituted aryl group, provided that $R^{58}$ and $R^{59}$ may be bonded together to form a ring structure. m is an integer ranging from 1 to 3.

The dry coated amount of the foregoing primary layer preferably falls within the range of from 2 to 200 mg/m$^2$ and more preferably 5 to 100 mg/m$^2$. If the dry coated amount thereof is less than 2 mg/m$^2$, the resulting coated film does not provide desired characteristic properties. On the other hand, if it exceeds 200 mg/m$^2$, any further effect thereof cannot be expected.

The foregoing primary layer can be formed by the following method.

More specifically, the primary layer may be formed by, for instance, a method comprising the steps of coating, onto a substrate such as an aluminum plate, a primary layer-forming solution prepared by dissolving the foregoing organic compound in a solvent such as water, an organic solvent such as methanol, ethanol or methyl ethyl ketone or a mixture thereof and then drying the coated layer; or a method comprising the steps of dipping a substrate such as an aluminum plate in a primary layer-forming solution prepared by dissolving the foregoing organic compound in a solvent such as water, an organic solvent such as methanol, ethanol or methyl ethyl ketone or a mixture thereof to thus adsorb the organic compound on the substrate surface, washing with, for instance, water and drying.

In the former method, it is preferred to use a primary layer-forming solution containing the organic compound in a concentration ranging from 0.005 to 10% by weight.

On the other hand, in the latter method, it is preferred to use a primary layer-forming solution containing the organic compound in a concentration ranging from 0.01 to 20% by weight, preferably 0.05 to 10% by weight and more preferably 0.1 to 5% by weight. In addition, the dipping temperature preferably ranges from 20 to 90° C. and more preferably 25 to 50° C. In this case, the dipping time preferably ranges from 0.1 second to 20 minutes and more preferably 2 second to one minute.

To the foregoing primary layer-forming solution, there may be added a basic substance such as ammonia, triethylamine or potassium hydroxide or an acidic substance such as hydrochloric acid or phosphoric acid to thus control the pH value thereof to 1 to 12. A yellow dye may additionally be incorporated into the solution to improve the tone reproduction of the resulting layer.

The lithographic printing plate precursor used in the present invention can be recorded with an IR laser and further the printing plate precursor can likewise be recorded by UV lamp or can thermally be recorded using, for instance, a thermal head.

The foregoing IR laser is preferably a laser emitting IR rays having a wavelength ranging from 700 to 1200 nm and more preferably a solid state laser or a semiconductor laser capable of emitting infrared rays having a wavelength falling within the same range specified above.

The present invention will hereinafter be explained in more detail with reference to the following non-limitative working Examples.

EXAMPLES

Preparation of Alkaline Liquid Developer

[Preparation of $SiO_2$-containing Alkaline Liquid Developer]

$SiO_2$-containing alkaline liquid developers were prepared as follows. Diverse compounds A to Z shown below, each was added at various concentrations summarized in the following Table 1 to one liter of an aqueous solution comprising 4.0% by weight of potassium salt whose molar ratio of $SiO_2/K_2O$ was 1.1 to obtain Developers (1) to (30). For comparison, the above aqueous solution comprising 4.0% by weight of potassium salt whose molar ratio of $SiO_2/K_2O$ was 1.1 was referred to as Developer (61).

[Preparation of Nonreducing sugar containing Alkaline Liquid Developer]

Nonreducing sugar-containing alkaline liquid developers were prepared as follows. Diverse compounds A to Z shown below, each was added at various concentrations summarized in the following Table 1 to one litter liter of an aqueous solution comprising 5.0% by weight of potassium salt consisting of a combination of a nonreducing sugar and a base: D-sorbitol/potassium oxide $K_2O$ to obtain Developers (31) to (60). For comparison, the above aqueous solution comprising 5.0% by weight of potassium salt consisting of a combination of a nonreducing sugar and a base: D-sorbitol/potassium oxide $K_2O$ was referred to Developer (62).

The compounds A to Z used in the developer

A–C
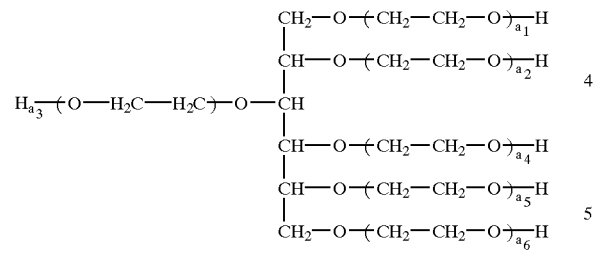

A: $a_1 + a_2 + a_3 + a_4 + a_5 + a_6 = 12$
B: $a_1 + a_2 + a_3 + a_4 + a_5 + a_6 = 30$
C: $a_1 + a_2 + a_3 + a_4 + a_5 + a_6 = 60$

D
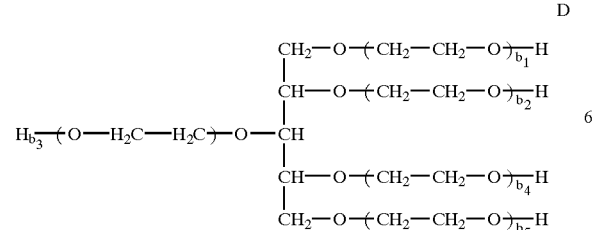

$b_1 + b_2 + b_3 + b_4 + b_5 = 30$

E
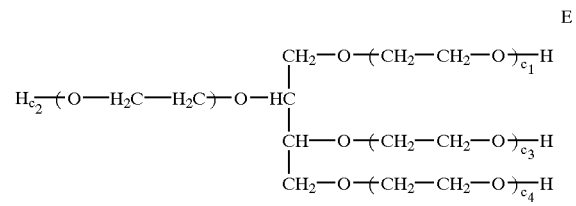

$c_1 + c_2 + c_3 + c_4 = 30$

F
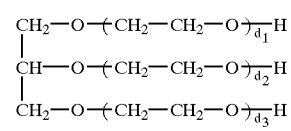

$d_1 + d_2 + d_3 = 30$

G
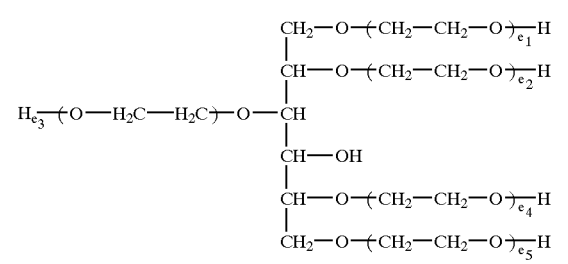

$e_1 + e_2 + e_3 + e_4 + e_5 = 30$

H
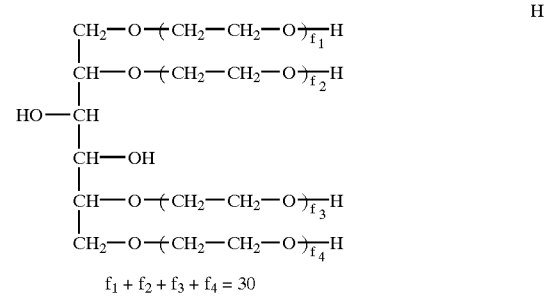

$f_1 + f_2 + f_3 + f_4 = 30$

I
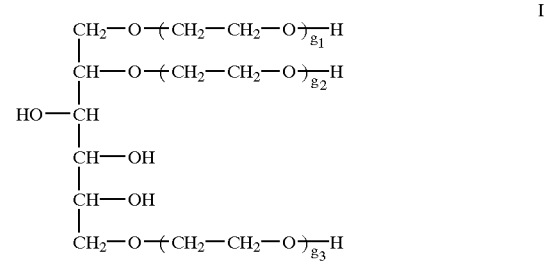

$g_1 + g_2 + g_3 = 30$

J
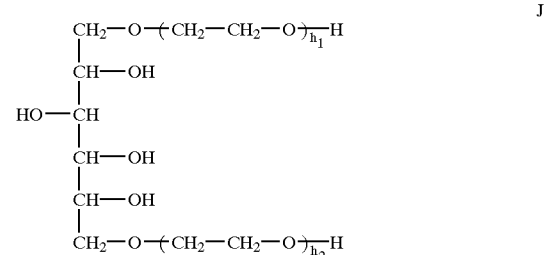

$h_1 + h_2 = 30$

K
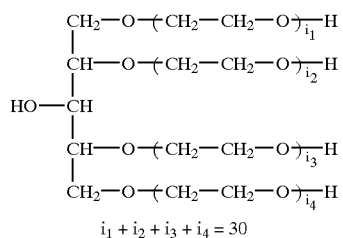
$i_1 + i_2 + i_3 + i_4 = 30$
L
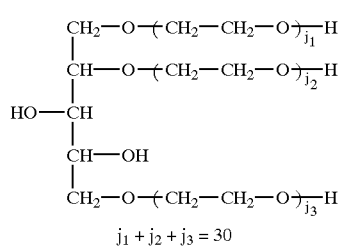
$j_1 + j_2 + j_3 = 30$
M
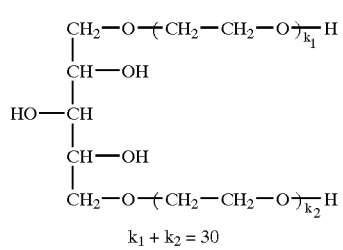
$k_1 + k_2 = 30$
N
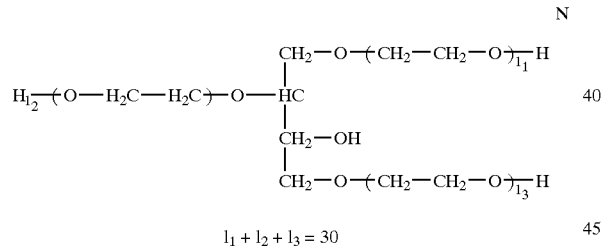
$l_1 + l_2 + l_3 = 30$
O
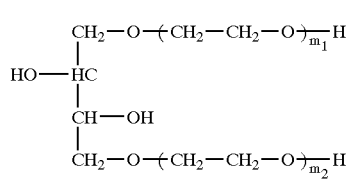
$m_1 + m_2 = 30$
P
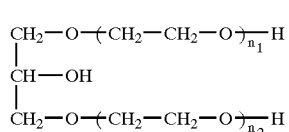
$n_1 + n_2 = 30$
Q
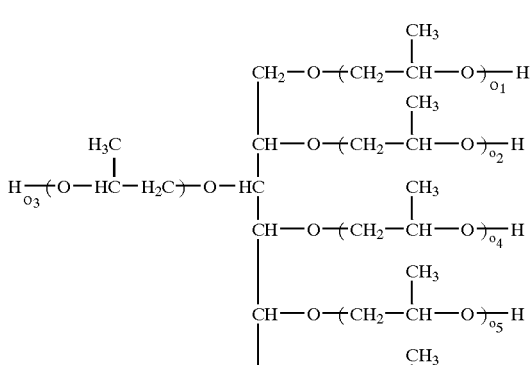
$o_1 + o_2 + o_3 + o_4 + o_5 + o_6 = 30$
R
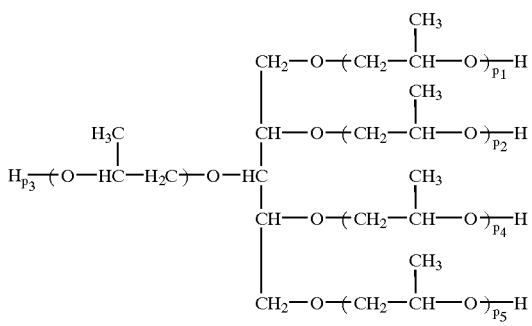
$p_1 + p_2 + p_3 + p_4 + p_5 = 30$
S
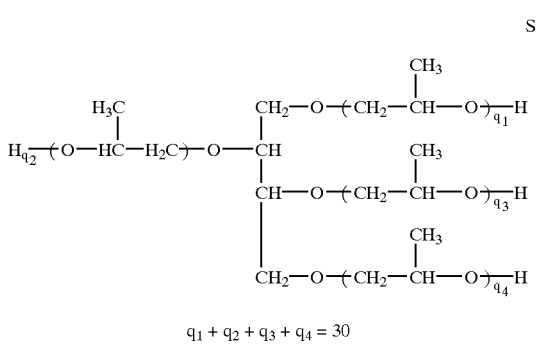
$q_1 + q_2 + q_3 + q_4 = 30$
T
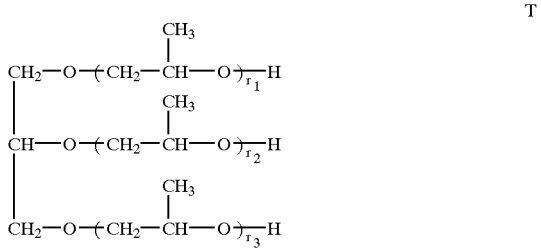
$r_1 + r_2 + r_3 = 30$

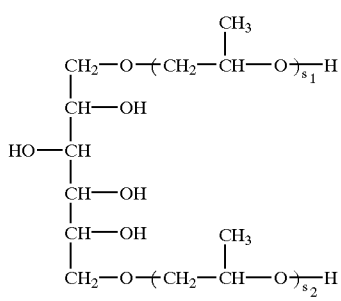

$s_1 + s_2 = 30$

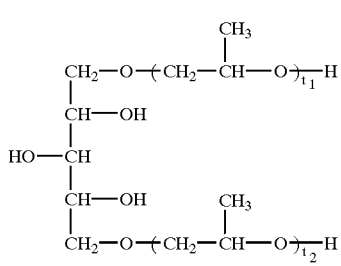

$t_1 + t_2 = 30$

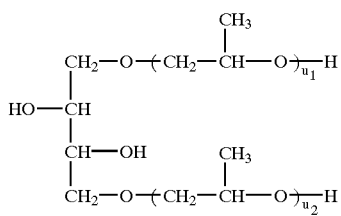

$u_1 + u_2 = 30$

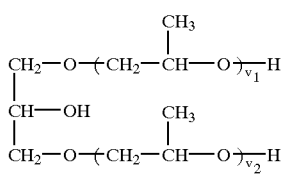

$v_1 + v_2 = 30$

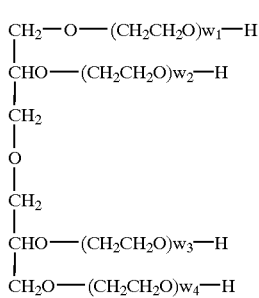

$w_1 + w_2 + w_3 + w_4 = 30$

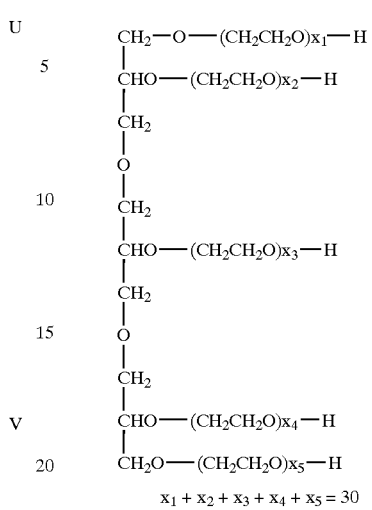

$x_1 + x_2 + x_3 + x_4 + x_5 = 30$

TABLE 1

| SiO$_2$-containing Developer No. | Compound | Concentration (g/liter) | Nonreducing sugar containing Developer No. | Compound | Concentration (g/liter) |
|---|---|---|---|---|---|
| (1) | A | 1.0 | (31) | A | 1.0 |
| (2) | B | 0.01 | (32) | B | 0.01 |
| (3) | B | 0.1 | (33) | B | 0.1 |
| (4) | B | 1.0 | (34) | B | 1.0 |
| (5) | B | 10.0 | (35) | B | 10.0 |
| (6) | B | 100.0 | (36) | B | 100.0 |
| (7) | C | 1.0 | (37) | C | 1.0 |
| (8) | D | 1.0 | (38) | D | 1.0 |
| (9) | E | 1.0 | (39) | E | 1.0 |
| (10) | F | 1.0 | (40) | F | 1.0 |
| (11) | G | 1.0 | (41) | G | 1.0 |
| (12) | H | 1.0 | (42) | H | 1.0 |
| (13) | I | 1.0 | (43) | I | 1.0 |
| (14) | J | 1.0 | (44) | J | 1.0 |
| (15) | K | 1.0 | (45) | K | 1.0 |
| (16) | L | 1.0 | (46) | L | 1.0 |
| (17) | M | 1.0 | (47) | M | 1.0 |
| (18) | N | 1.0 | (48) | N | 1.0 |
| (19) | O | 1.0 | (49) | O | 1.0 |
| (20) | P | 1.0 | (50) | P | 1.0 |
| (21) | Q | 1.0 | (51) | Q | 1.0 |
| (22) | R | 1.0 | (52) | R | 1.0 |
| (23) | S | 1.0 | (53) | S | 1.0 |
| (24) | T | 1.0 | (54) | T | 1.0 |
| (25) | U | 1.0 | (55) | U | 1.0 |
| (26) | V | 1.0 | (56) | V | 1.0 |
| (27) | W | 1.0 | (57) | W | 1.0 |
| (28) | X | 1.0 | (58) | X | 1.0 |
| (29) | Y | 1.0 | (59) | Y | 1.0 |
| (30) | Z | 1.0 | (60) | Z | 1.0 |
| (61) | — | — | (62) | — | — |

Examples 1 to 60 and Comparative Examples 1 and 2

Lithographic printing plate precursors (IR-presensitized plates) to be processed in Examples 1 to 60 and Comparative Examples 1 and 2 were prepared by the following procedure.

Then, Developers (1) to (60) were used in development in Examples 1 to 60, respectively, and Developers (61) and (62) were used in development in Comparative Examples 1 and 2, respectively.

Preparation of Lithographic Printing Plate Precursor (1)

An aluminum plate of 0.3 mm thick (grade 1050) was washed with trichloroethylene to be degreased, and surface-grained with a nylon brush and an aqueous suspension of 400 mesh pumice stone, and then sufficiently washed with water. The aluminum plate was then subjected to an immersed-electrolytic etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3 g/m². Then it was anodized in a 7% aqueous solution of sulfuric acid at a DC current density of 15 A/dm² so that the thickness of the resulting anodized layer was 3 g/m², washed with water, and then dried. Thereafter, the aluminum plate was treated with a 2.5% aqueous solution of sodium silicate at 30° C. for 10 seconds, coated with the following coating solution of primary layer, and dried under 80° C. for 15 seconds to obtain a substrate. The coated amount of the primary layer after drying was 15 mg/m².

<Coating Solution of Primary Layer>

| | |
|---|---|
| Copolymer P (molecular weight: 28,000) represented by the formula below | 0.3 g |
| Methanol | 100 g |
| Water | 1 g |

$$-(CH_2-\underset{H}{\overset{H}{C}})_{85}- \quad -(CH_2-\underset{H}{\overset{H}{C}})_{15}-$$
        |                              |
      COOH                          CH₂N⁺Et₃Cl⁻

Copolymer P

Synthesis Example 1

Synthesis of Component (B1): Alkali-Soluble High Molecular Weight Compound (Copolymer) Having Carboxyl Group To a 20 ml volume three-necked flask equipped with a stirring machine, a cooling tube and a dropping funnel, there were added 6.39 g (0.045 mole) of n-propyl methacrylate, 1.29 g (0.015 mole) of methacrylic acid and 20 g of 1-methoxy-2-propanol and then the resulting mixture was stirred while heating it at 65° in a hot water bath. To this mixture, there was added 0.15 g of "V-601" (available from WAKO Pure Chemical Co., Ltd.) and then the mixture was stirred in a nitrogen gas stream for 2 hours while retaining the same at 70°. To this reaction mixture, there was further dropwise added a mixture comprising 6.39 g (0.045 mole) of n-propyl methacrylate, 1.29 g (0.015 mole ) of methacrylic acid, 20 g of 1-methoxy-2-propanol and 0.15 of "V-601" through a dropping funnel over 2 hours. After the dropwise addition of the mixture, the resulting mixture was additionally stirred at 90° for 2 hours. After the completion of the reaction, 40 g of methanol was added to the reaction mixture, followed by cooling the mixture, introduction of the resulting mixture into 2 L of water while stirring the water, stirring the mixture over 30 minutes, filtration of the reaction mixture to remove precipitates thus formed, and then drying the precipitates to give 15 g of a white solid. The weight-average molecular weight polystyrene standard) of the copolymer was determined by the gel permeation chromatography and it was found to be 53,000.

Synthesis Example 2

Synthesis of Component (B1): Alkali-Soluble High Molecular Weight Compound (Copolymer) having Carboxyl Group According to the same procedure as in Synthesis Example 1, ethyl methacrylate/isobutyl methacrylate/methacrylic acid (mole%: 35/35/30) were used to synthesize a copolymer. The weight-average molecular weight (polystyrene standard) of the copolymer was determined by the gel permeation chromatography and it was found to be 50,000.

Synthesis Example 3

(Synthesis of Component (B1): Polyurethane Resin Having Carboxyl Group

To a 500 ml volume three-necked round-bottom flask equipped with a cooler, there were added 14.6 g (0.109 mole) of 2,2-bis(hydroxymethyl)propionic acid, 13.3 g (0.0686 mole) of tetraethylene glycol and 2.05 g (0.0228 mole) of 1,4-butane diol, and then the mixture was dissolved in 118 g of N,N-dimethylacetamide. To this mixture, 30.8 g (0.123 mole) of 4,4'-diphenylmethane diisocyanate, 13.8 g (0.0819 mole) of hexamethylene diisocyanate and 0.1 of dilauric acid di-n-butyl tin as a catalyst were added, and then the resulting mixture was heated at 90° C. for 7 hours while stirring it.

To the reaction liquid, there were added 100 ml of N,N-dimethylacetamide, 50 ml of methanol and 50 ml of acetic acid, and then the mixture was stirred, and said mixture was charged into 4 liter of water with stirring to precipitate a white polymer. This polymer was separated, washed with water, and then dried under reduced pressure to give 60 g of the polymer.

The weight-average molecular weight (polystyrene standard) of the polymer was determined by the gel permeation chromatography and it was found to be 70,000. The content of carboxyl groups in the polymer was determined by titration and it was found to be 1.43 meq/g.

Synthesis Example 4

Synthesis of Component (B1): Polyurethane Resin Having Carboxyl Group

According to the same procedure as in Synthesis Example 3, the following diisocyanate compounds (mole %):

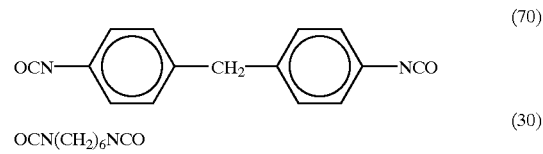

(70)

OCN(CH₂)₆NCO (30)

and the following diol compounds (mole %):

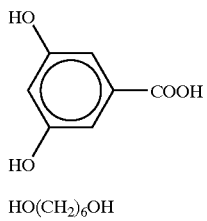

(60)

HO(CH$_2$)$_6$OH (40)

were used to synthesize a copolymer. The content of acids in the polymer was found to be 1.72 meq/g, and the weight-average molecular weight (polystyrene standard) of the copolymer was found to be 80,000.

Synthesis Example 5

Synthesis of Component (B2)

To a 500 ml volume three-necked flask equipped with a stirring machine, a cooling tube and a dropping funnel, there were added 31.0 g (0.36 mole) of methacrylic acid, 39.1 g (0.36 mole) of ethyl chloroformate and 200 ml of acetonitrile and then the resulting mixture was stirred while cooling it in an ice-water bath. To this mixture, there was dropwise added 36.4 g (0.36 mole) of triethylamine through the dropping funnel over about one hour. After the completion of the dropwise addition, the ice-water bath was removed and the mixture was stirred at room temperature for 30 minutes. To this reaction mixture, there was added 51.7 g (0.30 mole) of p-aminobenzene sulfonamide and the resulting mixture was stirred over one hour while warming the mixture at 70° C. in an oil bath. After the completion of the reaction, the mixture was introduced into 1 L of water while stirring the water and the resulting mixture was stirred for 30 minutes. This mixture was filtered to recover the precipitates, followed by addition of 500 ml of water to the precipitates to give a slurry, filtration of the slurry and drying the resulting solid to give N-(p-aminosulfonylphenyl) methacrylamide as a white solid (yield 46.9 g).

Then there were added 4.61 g (0.0192 mole) of N-(p-aminosulfonylphenyl) methacrylamide, 2.94 g (0.0258 mole) of ethyl methacrylate, 0.80 g (0.015 mole) of acrylonitrile and 20 g of N,N-dimethyl acetamide to a 20 ml volume three-necked flask equipped with a stirring machine, a cooling tube and a dropping funnel, followed by stirring the resulting mixture while heating it to 65° C. in a hot water bath. To this mixture, there was added 0.15 g of "V-65" (available from WAKO Pure Chemical Co., Ltd.) and then the mixture was stirred in a nitrogen gas stream for 2 hours while retaining the same at 65° C. To this reaction mixture, there was further dropwise added a mixture comprising 4.61 g of N-(p-aminosulfonylphenyl) methacrylamide, 2.94 g of ethyl methacrylate, 0.80 g of acrylonitrile, N,N-dimethyl acetamide and 0.15 g of "V-65" through the dropping funnel over 2 hours. After the dropwise addition of the mixture, the resulting mixture was additionally stirred at 65° C. for 2 hours. After the completion of the reaction, 40 g of methanol was added to the reaction mixture, followed by cooling the mixture, introduction of the resulting mixture into 2 L of water while stirring the water, stirring the mixture over 30 minutes, filtration of the reaction mixture to remove precipitates thus formed and then drying the precipitates to give 15 g of a white solid. The weight-average molecular weight (polystyrene standard) of the specific copolymer was determined by the gel permeation chromatography and it was found to be 53,000.

The following coating solution of image-forming layer was applied onto the surface of the aluminum substrate obtained above and dried under 150° for 30 seconds in an amount of 1.8 g/m$^2$ (weighed after drying) to obtain a positive-working lithographic printing plate precursor.

| <Coating solution of Image-foaming Layer> | |
|---|---|
| Copolymer of Synthesis Example 2 [Component (B1)] | 0.050 g |
| Copolymer of Synthesis Example 4 [Component (B1)] | 0.050 g |
| Copolymer of Synthesis Example 5 [Component (B2)] | 0.4 g |
| M,p-cresol novolac [Component (B2)] (m/p ratio = 6/4, weight-average molecular weight of 8,000, comprising 0.5% by weight of unreacted cresol) | 0.6 g |
| Cyanine dye A [Component (A + C)] | 0.1 g |
| Phthalic anhydride [Component (D)] | 0.05 g |
| P-toluene sulfonic acid | 0.002 g |
| Ethylviolet (counter ion: 6-hydroxy- β -naphthalene sulfonic acid) | 0.02 g |
| Esterified product of 1,2-diazonaphthoquinone-5-sulfonyl chloride and pyrogallol/acetone resin | 0.01 g |
| Fluorine atom-containing surfactant (trade name of MEGAFACE F-177 manufacture by Dainippon Ink and Chemicals, Inc.) | 0.05 g |
| Methyl ethyl ketone | 8 g |
| 1-Methoxy-2-propanol | 4 g |

The above obtained lithographic printing plate precursor was light-exposed using a semiconductor laser with an output power of 500 mW, a wave length of 830 nm and a beam diameter of 17 μm(1/e$^2$) at a horizontal scanning speed of 5 m/sec, and maintained at 25° C.

The lithographic printing plate precursor thus treated was processed by an automatic processor, PS900NP (manufactured by Fuji Photo Film Co., Ltd.) filled up with the above each developer, at a development temperature of 30° C. for 12 seconds. The plate was processed in the above processor at throughput of 50, 100, 200, 300, 400 and 500 m$^2$ without supplement of replenisher. After the development procedure, the plate was washed with water and treated with a gum solution (two-fold dilution of GU-7 manufactured by Fuji Photo Film Co., Ltd.) so as to obtain a lithographic printing plate.

Evaluation on Balance of Image Area/Non-Image Area

[Evaluation on Development of Non-Image Area]

Development effect on the non-image areas of the above lithographic printing plate obtained at immediately after the start of processing, and at the time of throughput of 50, 100, 200, 300, 400 and 500 m$^2$ plate was visually determined by observing undissolved residue on non-image areas. In addition, toning on a printed matter was also evaluated. The results were shown in Tables 2 and 3.

Criteria:

○: The non-image areas were sufficiently developed and there was observed no residue of the image-forming layer on the non-image areas. Toning on the printed matter was not observed.

Δ: The image-forming layer was left slightly on the non-image areas. Toning on the printed matter was not observed.

X: Failure of development was observed, and the image-forming layer was left on the non-image areas. Toning on the printed matter was observed.

[Evaluation of Impairment of Image Area]

Impairment of the image areas of the above lithographic printing plate obtained at immediately after the start of processing, and at the time of throughput of 50, 100, 200, 300, 400 and 500 m² plate was visually determined. The results were shown in Tables 4 and 5.

Criteria:

○: There was observed no impairment in the image areas. Color defect of the image areas on the printed matter was not observed.

Δ: Image density was slightly decreased, and the impairment of the image areas was partially observed. Color defect of the image areas on the printed matter was not observed.

X: Image density was largely decreased, and the impairment of the image areas was partially observed. Color defect of the image areas on the printed matter was observed.

Insoluble Matter in Developer

The developer which had been used in the processing of 1 m², 10 m² or 100 m² plate per one litter was left in a refrigerator at 5° C., at room temperature at from 20 to 25° C., or in a thermostatic chamber at 35° C. for one month, and then the insoluble matter in the developer was observed. The results were shown in Tables 6 and 7.

Criteria

○: There was no insoluble matter.

Δ: There was slightly insoluble matter, but the insoluble matter was dissolved and eliminated by shaking.

X: There was insoluble matter, even if the developer was shaken.

TABLE 2

| Example No | SiO$_2$-containing Developer No. | Development of Non-Image Area | | | | | | |
|---|---|---|---|---|---|---|---|---|
| | | Immediately after start | Throughput (m²) | | | | | |
| | | | 50 | 100 | 200 | 300 | 400 | 500 |
| 1 | (1) | ○ | ○ | ○ | ○ | ○ | ○ | ○ |
| 2 | (2) | ○ | ○ | ○ | ○ | ○ | ○ | ○ |
| 3 | (3) | ○ | ○ | ○ | ○ | ○ | ○ | ○ |
| 4 | (4) | ○ | ○ | ○ | ○ | ○ | ○ | ○ |
| 5 | (5) | ○ | ○ | ○ | ○ | ○ | ○ | ○ |
| 6 | (6) | ○ | ○ | ○ | ○ | ○ | ○ | ○ |
| 7 | (7) | ○ | ○ | ○ | ○ | ○ | ○ | ○ |
| 8 | (8) | ○ | ○ | ○ | ○ | ○ | ○ | ○ |
| 9 | (9) | ○ | ○ | ○ | ○ | ○ | ○ | ○ |
| 10 | (10) | ○ | ○ | ○ | ○ | ○ | ○ | ○ |
| 11 | (11) | ○ | ○ | ○ | ○ | ○ | ○ | ○ |
| 12 | (12) | ○ | ○ | ○ | ○ | ○ | ○ | ○ |
| 13 | (13) | ○ | ○ | ○ | ○ | ○ | ○ | ○ |
| 14 | (14) | ○ | ○ | ○ | ○ | ○ | ○ | ○ |
| 15 | (15) | ○ | ○ | ○ | ○ | ○ | ○ | ○ |
| 16 | (16) | ○ | ○ | ○ | ○ | ○ | ○ | ○ |
| 17 | (17) | ○ | ○ | ○ | ○ | ○ | ○ | ○ |
| 18 | (18) | ○ | ○ | ○ | ○ | ○ | ○ | ○ |
| 19 | (19) | ○ | ○ | ○ | ○ | ○ | ○ | ○ |
| 20 | (20) | ○ | ○ | ○ | ○ | ○ | ○ | ○ |
| 21 | (21) | ○ | ○ | ○ | ○ | ○ | ○ | ○ |
| 22 | (22) | ○ | ○ | ○ | ○ | ○ | ○ | ○ |
| 23 | (23) | ○ | ○ | ○ | ○ | ○ | ○ | ○ |
| 24 | (24) | ○ | ○ | ○ | ○ | ○ | ○ | ○ |
| 25 | (25) | ○ | ○ | ○ | ○ | ○ | ○ | ○ |
| 26 | (26) | ○ | ○ | ○ | ○ | ○ | ○ | ○ |
| 27 | (27) | ○ | ○ | ○ | ○ | ○ | ○ | ○ |
| 28 | (28) | ○ | ○ | ○ | ○ | ○ | ○ | ○ |
| 29 | (29) | ○ | ○ | ○ | ○ | ○ | ○ | ○ |
| 30 | (30) | ○ | ○ | ○ | ○ | ○ | ○ | ○ |
| Comparative Ex. 1 | (61) | ○ | ○ | Δ | Δ | Δ | X | X |

TABLE 3

| Example No. | Nonreducing sugar-containing Developer No. | Development of Non-Image Area | | | | | | |
|---|---|---|---|---|---|---|---|---|
| | | Immediately after start | Throughput (m²) | | | | | |
| | | | 50 | 100 | 200 | 300 | 400 | 500 |
| 31 | (31) | ○ | ○ | ○ | ○ | ○ | ○ | ○ |
| 32 | (32) | ○ | ○ | ○ | ○ | ○ | ○ | ○ |
| 33 | (33) | ○ | ○ | ○ | ○ | ○ | ○ | ○ |
| 34 | (34) | ○ | ○ | ○ | ○ | ○ | ○ | ○ |
| 35 | (35) | ○ | ○ | ○ | ○ | ○ | ○ | ○ |
| 36 | (36) | ○ | ○ | ○ | ○ | ○ | ○ | ○ |
| 37 | (37) | ○ | ○ | ○ | ○ | ○ | ○ | ○ |
| 38 | (38) | ○ | ○ | ○ | ○ | ○ | ○ | ○ |
| 39 | (39) | ○ | ○ | ○ | ○ | ○ | ○ | ○ |
| 40 | (40) | ○ | ○ | ○ | ○ | ○ | ○ | ○ |
| 41 | (41) | ○ | ○ | ○ | ○ | ○ | ○ | ○ |
| 42 | (42) | ○ | ○ | ○ | ○ | ○ | ○ | ○ |
| 43 | (43) | ○ | ○ | ○ | ○ | ○ | ○ | ○ |
| 44 | (44) | ○ | ○ | ○ | ○ | ○ | ○ | ○ |
| 45 | (45) | ○ | ○ | ○ | ○ | ○ | ○ | ○ |
| 46 | (46) | ○ | ○ | ○ | ○ | ○ | ○ | ○ |
| 47 | (47) | ○ | ○ | ○ | ○ | ○ | ○ | ○ |
| 48 | (48) | ○ | ○ | ○ | ○ | ○ | ○ | ○ |
| 49 | (49) | ○ | ○ | ○ | ○ | ○ | ○ | ○ |
| 50 | (50) | ○ | ○ | ○ | ○ | ○ | ○ | ○ |
| 51 | (51) | ○ | ○ | ○ | ○ | ○ | ○ | ○ |
| 52 | (52) | ○ | ○ | ○ | ○ | ○ | ○ | ○ |
| 53 | (53) | ○ | ○ | ○ | ○ | ○ | ○ | ○ |
| 54 | (54) | ○ | ○ | ○ | ○ | ○ | ○ | ○ |
| 55 | (55) | ○ | ○ | ○ | ○ | ○ | ○ | ○ |
| 56 | (56) | ○ | ○ | ○ | ○ | ○ | ○ | ○ |
| 57 | (57) | ○ | ○ | ○ | ○ | ○ | ○ | ○ |
| 58 | (58) | ○ | ○ | ○ | ○ | ○ | ○ | ○ |
| 59 | (59) | ○ | ○ | ○ | ○ | ○ | ○ | ○ |
| 60 | (60) | ○ | ○ | ○ | ○ | ○ | ○ | ○ |
| Comparative Ex. 2 | (62) | ○ | ○ | Δ | Δ | Δ | X | X |

TABLE 4

| Example No. | SiO$_2$-containing Developer No. | Development of Non-Image Area | | | | | | |
|---|---|---|---|---|---|---|---|---|
| | | Immediately after start | Throughput (m²) | | | | | |
| | | | 50 | 100 | 200 | 300 | 400 | 500 |
| 1 | (1) | ○ | ○ | ○ | ○ | ○ | ○ | ○ |
| 2 | (2) | ○ | ○ | ○ | ○ | ○ | ○ | ○ |
| 3 | (3) | ○ | ○ | ○ | ○ | ○ | ○ | ○ |
| 4 | (4) | ○ | ○ | ○ | ○ | ○ | ○ | ○ |
| 5 | (5) | ○ | ○ | ○ | ○ | ○ | ○ | ○ |
| 6 | (6) | ○ | ○ | ○ | ○ | ○ | ○ | ○ |
| 7 | (7) | ○ | ○ | ○ | ○ | ○ | ○ | ○ |
| 8 | (8) | ○ | ○ | ○ | ○ | ○ | ○ | ○ |
| 9 | (9) | ○ | ○ | ○ | ○ | ○ | ○ | ○ |
| 10 | (10) | ○ | ○ | ○ | ○ | ○ | ○ | ○ |
| 11 | (11) | ○ | ○ | ○ | ○ | ○ | ○ | ○ |
| 12 | (12) | ○ | ○ | ○ | ○ | ○ | ○ | ○ |
| 13 | (13) | ○ | ○ | ○ | ○ | ○ | ○ | ○ |
| 14 | (14) | ○ | ○ | ○ | ○ | ○ | ○ | ○ |
| 15 | (15) | ○ | ○ | ○ | ○ | ○ | ○ | ○ |
| 16 | (16) | ○ | ○ | ○ | ○ | ○ | ○ | ○ |
| 17 | (17) | ○ | ○ | ○ | ○ | ○ | ○ | ○ |
| 18 | (18) | ○ | ○ | ○ | ○ | ○ | ○ | ○ |
| 19 | (19) | ○ | ○ | ○ | ○ | ○ | ○ | ○ |
| 20 | (20) | ○ | ○ | ○ | ○ | ○ | ○ | ○ |
| 21 | (21) | ○ | ○ | ○ | ○ | ○ | ○ | ○ |
| 22 | (22) | ○ | ○ | ○ | ○ | ○ | ○ | ○ |
| 23 | (23) | ○ | ○ | ○ | ○ | ○ | ○ | ○ |

TABLE 4-continued

| Example No. | SiO$_2$-containing Developer No. | Development of Non-Image Area | | | | | | |
|---|---|---|---|---|---|---|---|---|
| | | Immediately after start | \multicolumn{7}{c}{Throughput (m$^2$)} |
| | | | 50 | 100 | 200 | 300 | 400 | 500 |
| 24 | (24) | ○ | ○ | ○ | ○ | ○ | ○ | ○ |
| 25 | (25) | ○ | ○ | ○ | ○ | ○ | ○ | ○ |
| 26 | (26) | ○ | ○ | ○ | ○ | ○ | ○ | ○ |
| 27 | (27) | ○ | ○ | ○ | ○ | ○ | ○ | ○ |
| 28 | (28) | ○ | ○ | ○ | ○ | ○ | ○ | ○ |
| 29 | (29) | ○ | ○ | ○ | ○ | ○ | ○ | ○ |
| 30 | (30) | ○ | ○ | ○ | ○ | ○ | ○ | ○ |
| Comparative Ex. 1 | (61) | Δ | X | X | X | X | X | X |

TABLE 5

| Example No. | Nonreducing sugar-containing Developer No. | Development of Non-Image Area | | | | | | |
|---|---|---|---|---|---|---|---|---|
| | | Immediately after start | \multicolumn{7}{c}{Throughput (m$^2$)} |
| | | | 50 | 100 | 200 | 300 | 400 | 500 |
| 31 | (31) | ○ | ○ | ○ | ○ | ○ | ○ | ○ |
| 32 | (32) | ○ | ○ | ○ | ○ | ○ | ○ | ○ |
| 33 | (33) | ○ | ○ | ○ | ○ | ○ | ○ | ○ |
| 34 | (34) | ○ | ○ | ○ | ○ | ○ | ○ | ○ |
| 35 | (35) | ○ | ○ | ○ | ○ | ○ | ○ | ○ |
| 36 | (36) | ○ | ○ | ○ | ○ | ○ | ○ | ○ |
| 37 | (37) | ○ | ○ | ○ | ○ | ○ | ○ | ○ |
| 38 | (38) | ○ | ○ | ○ | ○ | ○ | ○ | ○ |
| 39 | (39) | ○ | ○ | ○ | ○ | ○ | ○ | ○ |
| 40 | (40) | ○ | ○ | ○ | ○ | ○ | ○ | ○ |
| 41 | (41) | ○ | ○ | ○ | ○ | ○ | ○ | ○ |
| 42 | (42) | ○ | ○ | ○ | ○ | ○ | ○ | ○ |
| 43 | (43) | ○ | ○ | ○ | ○ | ○ | ○ | ○ |
| 44 | (44) | ○ | ○ | ○ | ○ | ○ | ○ | ○ |
| 45 | (45) | ○ | ○ | ○ | ○ | ○ | ○ | ○ |
| 46 | (46) | ○ | ○ | ○ | ○ | ○ | ○ | ○ |
| 47 | (47) | ○ | ○ | ○ | ○ | ○ | ○ | ○ |
| 48 | (48) | ○ | ○ | ○ | ○ | ○ | ○ | ○ |
| 49 | (49) | ○ | ○ | ○ | ○ | ○ | ○ | ○ |
| 50 | (50) | ○ | ○ | ○ | ○ | ○ | ○ | ○ |
| 51 | (51) | ○ | ○ | ○ | ○ | ○ | ○ | ○ |
| 52 | (52) | ○ | ○ | ○ | ○ | ○ | ○ | ○ |
| 53 | (53) | ○ | ○ | ○ | ○ | ○ | ○ | ○ |
| 54 | (54) | ○ | ○ | ○ | ○ | ○ | ○ | ○ |
| 55 | (55) | ○ | ○ | ○ | ○ | ○ | ○ | ○ |
| 56 | (56) | ○ | ○ | ○ | ○ | ○ | ○ | ○ |
| 57 | (57) | ○ | ○ | ○ | ○ | ○ | ○ | ○ |
| 58 | (58) | ○ | ○ | ○ | ○ | ○ | ○ | ○ |
| 59 | (59) | ○ | ○ | ○ | ○ | ○ | ○ | ○ |
| 60 | (60) | ○ | ○ | ○ | ○ | ○ | ○ | ○ |
| Comparative Ex. 2 | (62) | Δ | X | X | X | X | X | X |

TABLE 6

| | | Insoluble Matter in Developer | | | | | | | | |
|---|---|---|---|---|---|---|---|---|---|---|
| Example No. | SiO$_2$-containing Developer No. | \multicolumn{9}{c}{Throughput (plate m$^2$/L)} |
| | | \multicolumn{3}{c}{Storage Temperature 5° C.} | \multicolumn{3}{c}{20~25° C.} | \multicolumn{3}{c}{35° C.} |
| | | 1 | 10 | 100 | 1 | 10 | 100 | 1 | 10 | 100 |
| 1 | (1) | ○ | ○ | ○ | ○ | ○ | ○ | ○ | ○ | ○ |
| 2 | (2) | ○ | ○ | ○ | ○ | ○ | ○ | ○ | ○ | ○ |
| 3 | (3) | ○ | ○ | ○ | ○ | ○ | ○ | ○ | ○ | ○ |
| 4 | (4) | ○ | ○ | ○ | ○ | ○ | ○ | ○ | ○ | ○ |
| 5 | (5) | ○ | ○ | ○ | ○ | ○ | ○ | ○ | ○ | ○ |
| 6 | (6) | ○ | ○ | ○ | ○ | ○ | ○ | ○ | ○ | ○ |
| 7 | (7) | ○ | ○ | ○ | ○ | ○ | ○ | ○ | ○ | ○ |
| 8 | (8) | ○ | ○ | ○ | ○ | ○ | ○ | ○ | ○ | ○ |
| 9 | (9) | ○ | ○ | ○ | ○ | ○ | ○ | ○ | ○ | ○ |
| 10 | (10) | ○ | ○ | ○ | ○ | ○ | ○ | ○ | ○ | ○ |
| 11 | (11) | ○ | ○ | ○ | ○ | ○ | ○ | ○ | ○ | ○ |
| 12 | (12) | ○ | ○ | ○ | ○ | ○ | ○ | ○ | ○ | ○ |
| 13 | (13) | ○ | ○ | ○ | ○ | ○ | ○ | ○ | ○ | ○ |
| 14 | (14) | ○ | ○ | ○ | ○ | ○ | ○ | ○ | ○ | ○ |
| 15 | (15) | ○ | ○ | ○ | ○ | ○ | ○ | ○ | ○ | ○ |
| 16 | (16) | ○ | ○ | ○ | ○ | ○ | ○ | ○ | ○ | ○ |
| 17 | (17) | ○ | ○ | ○ | ○ | ○ | ○ | ○ | ○ | ○ |
| 18 | (18) | ○ | ○ | ○ | ○ | ○ | ○ | ○ | ○ | ○ |
| 19 | (19) | ○ | ○ | ○ | ○ | ○ | ○ | ○ | ○ | ○ |
| 20 | (20) | ○ | ○ | ○ | ○ | ○ | ○ | ○ | ○ | ○ |
| 21 | (21) | ○ | ○ | ○ | ○ | ○ | ○ | ○ | ○ | ○ |
| 22 | (22) | ○ | ○ | ○ | ○ | ○ | ○ | ○ | ○ | ○ |
| 23 | (23) | ○ | ○ | ○ | ○ | ○ | ○ | ○ | ○ | ○ |
| 24 | (24) | ○ | ○ | ○ | ○ | ○ | ○ | ○ | ○ | ○ |
| 25 | (25) | ○ | ○ | ○ | ○ | ○ | ○ | ○ | ○ | ○ |
| 26 | (26) | ○ | ○ | ○ | ○ | ○ | ○ | ○ | ○ | ○ |
| 27 | (27) | ○ | ○ | ○ | ○ | ○ | ○ | ○ | ○ | ○ |
| 28 | (28) | ○ | ○ | ○ | ○ | ○ | ○ | ○ | ○ | ○ |
| 29 | (29) | ○ | ○ | ○ | ○ | ○ | ○ | ○ | ○ | ○ |
| 30 | (30) | ○ | ○ | ○ | ○ | ○ | ○ | ○ | ○ | ○ |
| Comparative Ex. 1 | (61) | X | X | X | Δ | X | X | ○ | Δ | X |

TABLE 7

| | | Insoluble Matter in Developer | | | | | | | | |
|---|---|---|---|---|---|---|---|---|---|---|
| Example No. | Nonreducing sugar-containing Developer No. | \multicolumn{9}{c}{Throughput (plate m$^2$/L)} |
| | | \multicolumn{3}{c}{Storage Temperature 5° C.} | \multicolumn{3}{c}{20~25° C.} | \multicolumn{3}{c}{35° C.} |
| | | 1 | 10 | 100 | 1 | 10 | 100 | 1 | 10 | 100 |
| 31 | (31) | ○ | ○ | ○ | ○ | ○ | ○ | ○ | ○ | ○ |
| 32 | (32) | ○ | ○ | ○ | ○ | ○ | ○ | ○ | ○ | ○ |
| 33 | (33) | ○ | ○ | ○ | ○ | ○ | ○ | ○ | ○ | ○ |
| 34 | (34) | ○ | ○ | ○ | ○ | ○ | ○ | ○ | ○ | ○ |
| 35 | (35) | ○ | ○ | ○ | ○ | ○ | ○ | ○ | ○ | ○ |
| 36 | (36) | ○ | ○ | ○ | ○ | ○ | ○ | ○ | ○ | ○ |
| 37 | (37) | ○ | ○ | ○ | ○ | ○ | ○ | ○ | ○ | ○ |
| 38 | (38) | ○ | ○ | ○ | ○ | ○ | ○ | ○ | ○ | ○ |
| 39 | (39) | ○ | ○ | ○ | ○ | ○ | ○ | ○ | ○ | ○ |
| 40 | (40) | ○ | ○ | ○ | ○ | ○ | ○ | ○ | ○ | ○ |
| 41 | (41) | ○ | ○ | ○ | ○ | ○ | ○ | ○ | ○ | ○ |
| 42 | (42) | ○ | ○ | ○ | ○ | ○ | ○ | ○ | ○ | ○ |
| 43 | (43) | ○ | ○ | ○ | ○ | ○ | ○ | ○ | ○ | ○ |
| 44 | (44) | ○ | ○ | ○ | ○ | ○ | ○ | ○ | ○ | ○ |
| 45 | (45) | ○ | ○ | ○ | ○ | ○ | ○ | ○ | ○ | ○ |
| 46 | (46) | ○ | ○ | ○ | ○ | ○ | ○ | ○ | ○ | ○ |
| 47 | (47) | ○ | ○ | ○ | ○ | ○ | ○ | ○ | ○ | ○ |
| 48 | (48) | ○ | ○ | ○ | ○ | ○ | ○ | ○ | ○ | ○ |
| 49 | (49) | ○ | ○ | ○ | ○ | ○ | ○ | ○ | ○ | ○ |
| 50 | (50) | ○ | ○ | ○ | ○ | ○ | ○ | ○ | ○ | ○ |

TABLE 7-continued

Insoluble Matter in Developer

| Example No. | Nonreducing sugar-containing Developer No. | Throughput (plate m²/L) | | | | | | | | |
|---|---|---|---|---|---|---|---|---|---|---|
| | | Storage Temperature 5° C. | | | 20~25° C. | | | 35° C. | | |
| | | 1 | 10 | 100 | 1 | 10 | 100 | 1 | 10 | 100 |
| 51 | (51) | ○ | ○ | ○ | ○ | ○ | ○ | ○ | ○ | ○ |
| 52 | (52) | ○ | ○ | ○ | ○ | ○ | ○ | ○ | ○ | ○ |
| 53 | (53) | ○ | ○ | ○ | ○ | ○ | ○ | ○ | ○ | ○ |
| 54 | (54) | ○ | ○ | ○ | ○ | ○ | ○ | ○ | ○ | ○ |
| 55 | (55) | ○ | ○ | ○ | ○ | ○ | ○ | ○ | ○ | ○ |
| 56 | (56) | ○ | ○ | ○ | ○ | ○ | ○ | ○ | ○ | ○ |
| 57 | (57) | ○ | ○ | ○ | ○ | ○ | ○ | ○ | ○ | ○ |
| 58 | (58) | ○ | ○ | ○ | ○ | ○ | ○ | ○ | ○ | ○ |
| 59 | (59) | ○ | ○ | ○ | ○ | ○ | ○ | ○ | ○ | ○ |
| 60 | (60) | ○ | ○ | ○ | ○ | ○ | ○ | ○ | ○ | ○ |
| Comparative Ex. 2 | (62) | X | X | X | Δ | X | X | ○ | Δ | X |

Examples 61 to 120 and Comparative Examples 3 and 4

Lithographic printing plate precursors (IR-presensitized plates) to be processed in Examples 61 to 120 and Comparative Examples 3 and 4 were prepared by the following procedure. Then, Developers (1) to (60) were used in development in Examples 61 to 120, respectively, and Developers (61) and (62) were used in development in Comparative Examples 3 and 4, respectively.

Preparation of Lithographic Printing Plate Precursor (2)

On the aluminum substrate treated and provided thereon the primary layer as described in the above <Preparation of Lithographic Printing Plate Precursor (1)>, the following photosensitive solution 2 was applied in amount of 0.85 g/m² (weighed after drying) through a wire bar, and dried by using Perfect Over PH200 manufactured by TABAI Co. under a wind control of 7, at a temperature of 140° for 50 seconds. Further, the following photosensitive solution 3 was applied thereon in amount of 0.16 g/m² (weighed after drying) through a wire bar, and then dried by using Perfect Over PH200 manufactured by TABAI Co. under wind control of 7, at a temperature of 120° for 60 seconds to obtain a lithographic printing plate precursor having a thermally-sensitive layer consisting of two-layered structure.

<Photosensitive Solution 2>

| | |
|---|---|
| Copolymer of Synthesis Example 2 | 0.050 g |
| Copolymer of Synthesis Example 4 | 0.050 g |
| N-(4-Aminosurfonylphenyl)methacrylamide/acrylonitrile/methyl methacrylate (36/34/30, weight-average molecular weight of 50,000) | 1.896 g |
| Cresol novolac (m/p ratio = 6/4, weight-average molecular weight of 4,500, comprising 0.8% by weight of unreacted monomer) | 0.237 g |
| Cyanine dye A | 0.109 g |
| 4,4'-Bishydroxyphenylsulfone | 0.063 g |
| Tetrahydrophthalic anhydride | 0.190 g |
| P-toluene sulifonic acid | 0.008 g |
| Ethylviolet (counter ion: 6-hydroxy-β-naphthalene sulfonic acid) | 0.05 g |
| Fluorine atom-containing surfactant (trade name of F-176 manufactured by Dainippon Ink and Chemicals, Inc.) | 0.035 g |
| Methyl ethyl ketone | 26.6 g |
| 1-Methoxy-2-propanol | 13.6 g |
| γ-butyrolactone | 13.8 g |

<Photosensitive Solution 3>

| | |
|---|---|
| Copolymer of Synthesis Example 2 | 0.050 g |
| Copolymer of Synthesis Example 4 | 0.050 g |
| Cresol novolac (m/p ratio = 6/4, weight-average molecular weight of 4,500, comprising 0.8% by weight of unreacted monomer) | 0.237 g |
| Cyanine dye A | 0.047 g |
| Dodecyl stearate | 0.060 g |
| 3-Methoxy-4-diazodiphenylamine hexafluorophosphate | 0.030 g |
| Fluorine atom-containing surfactant (trade name of F-176 (20% solution) manufactured by Dainippon Ink and Chemicals, Inc.) | 0.110 g |
| Fluorine atom-containing surfactant (trade name of MCF312F (30% solution) manufactured by Dainippon Ink and Chemicals, Inc.) | 0.12 g |
| Methyl ethyl ketone | 15.1 g |
| 1-Methoxy-2-propanol | 7.7 g |

The above obtained lithographic printing plate precursor was light-exposed using a semiconductor laser with an output power of 500 mW, a wave length of 830 nm and a beam diameter of 17 μm(1/e²) at a horizontal scanning speed of 5 m/sec, and maintained at 25° C.

The lithographic printing plate precursor thus treated was processed by an automatic processor, PS900NP (manufactured by Fuji Photo Film Co., Ltd.) filled up with the above each developer, at a development temperature of 30° C. for 12 seconds. The plate was processed in the above processor at throughput of 50, 100, 200, 300 400 and 500 m² without supplement of replenisher. After the development procedure, the plate was washed with water and treated with a gum solution (two-fold dilution of GU-7 manufactured by Fuji Photo Film Co., Ltd.) so as to obtain a lithographic printing plate.

The lithographic printing plates thus obtained were evaluated in the same manner as described in Examples 1 to 60. The results were shown in Tables 8 and 9 for development of non-image areas, in Tables 10 and 11 for impairment of image areas, and in Tables 12 and 13 for insoluble matter in developer.

TABLE 8

| Example No. | SiO₂-containing Developer No. | Development of Non-Image Area | | | | | | |
|---|---|---|---|---|---|---|---|---|
| | | Immediately after start | Throughput (m²) | | | | | |
| | | | 50 | 100 | 200 | 300 | 400 | 500 |
| 61 | (1) | ○ | ○ | ○ | ○ | ○ | ○ | ○ |
| 62 | (2) | ○ | ○ | ○ | ○ | ○ | ○ | ○ |
| 63 | (3) | ○ | ○ | ○ | ○ | ○ | ○ | ○ |
| 64 | (4) | ○ | ○ | ○ | ○ | ○ | ○ | ○ |
| 65 | (5) | ○ | ○ | ○ | ○ | ○ | ○ | ○ |
| 66 | (6) | ○ | ○ | ○ | ○ | ○ | ○ | ○ |
| 67 | (7) | ○ | ○ | ○ | ○ | ○ | ○ | ○ |
| 68 | (8) | ○ | ○ | ○ | ○ | ○ | ○ | ○ |
| 69 | (9) | ○ | ○ | ○ | ○ | ○ | ○ | ○ |
| 70 | (10) | ○ | ○ | ○ | ○ | ○ | ○ | ○ |
| 71 | (11) | ○ | ○ | ○ | ○ | ○ | ○ | ○ |

TABLE 8-continued

| Example No. | SiO$_2$-containing Developer No. | Immediately after start | \multicolumn{6}{c}{Development of Non-Image Area Throughput (m$^2$)} | | | | | |
|---|---|---|---|---|---|---|---|---|
| | | | 50 | 100 | 200 | 300 | 400 | 500 |
| 72 | (12) | ○ | ○ | ○ | ○ | ○ | ○ | ○ |
| 73 | (13) | ○ | ○ | ○ | ○ | ○ | ○ | ○ |
| 74 | (14) | ○ | ○ | ○ | ○ | ○ | ○ | ○ |
| 75 | (15) | ○ | ○ | ○ | ○ | ○ | ○ | ○ |
| 76 | (16) | ○ | ○ | ○ | ○ | ○ | ○ | ○ |
| 77 | (17) | ○ | ○ | ○ | ○ | ○ | ○ | ○ |
| 78 | (18) | ○ | ○ | ○ | ○ | ○ | ○ | ○ |
| 79 | (19) | ○ | ○ | ○ | ○ | ○ | ○ | ○ |
| 80 | (20) | ○ | ○ | ○ | ○ | ○ | ○ | ○ |
| 81 | (21) | ○ | ○ | ○ | ○ | ○ | ○ | ○ |
| 82 | (22) | ○ | ○ | ○ | ○ | ○ | ○ | ○ |
| 83 | (23) | ○ | ○ | ○ | ○ | ○ | ○ | ○ |
| 84 | (24) | ○ | ○ | ○ | ○ | ○ | ○ | ○ |
| 85 | (25) | ○ | ○ | ○ | ○ | ○ | ○ | ○ |
| 86 | (26) | ○ | ○ | ○ | ○ | ○ | ○ | ○ |
| 87 | (27) | ○ | ○ | ○ | ○ | ○ | ○ | ○ |
| 88 | (28) | ○ | ○ | ○ | ○ | ○ | ○ | ○ |
| 89 | (29) | ○ | ○ | ○ | ○ | ○ | ○ | ○ |
| 90 | (30) | ○ | ○ | ○ | ○ | ○ | ○ | ○ |
| Comparative Ex. 3 | (61) | ○ | ○ | Δ | Δ | Δ | X | X |

TABLE 9

| Example No. | Nonreducing sugar-containing Developer No. | Immediately after start | \multicolumn{6}{c}{Development of Non-Image Area Throughput (m$^2$)} | | | | | |
|---|---|---|---|---|---|---|---|---|
| | | | 50 | 100 | 200 | 300 | 400 | 500 |
| 31 | (31) | ○ | ○ | ○ | ○ | ○ | ○ | ○ |
| 32 | (32) | ○ | ○ | ○ | ○ | ○ | ○ | ○ |
| 33 | (33) | ○ | ○ | ○ | ○ | ○ | ○ | ○ |
| 34 | (34) | ○ | ○ | ○ | ○ | ○ | ○ | ○ |
| 35 | (35) | ○ | ○ | ○ | ○ | ○ | ○ | ○ |
| 36 | (36) | ○ | ○ | ○ | ○ | ○ | ○ | ○ |
| 37 | (37) | ○ | ○ | ○ | ○ | ○ | ○ | ○ |
| 38 | (38) | ○ | ○ | ○ | ○ | ○ | ○ | ○ |
| 39 | (39) | ○ | ○ | ○ | ○ | ○ | ○ | ○ |
| 40 | (40) | ○ | ○ | ○ | ○ | ○ | ○ | ○ |
| 41 | (41) | ○ | ○ | ○ | ○ | ○ | ○ | ○ |
| 42 | (42) | ○ | ○ | ○ | ○ | ○ | ○ | ○ |
| 43 | (43) | ○ | ○ | ○ | ○ | ○ | ○ | ○ |
| 44 | (44) | ○ | ○ | ○ | ○ | ○ | ○ | ○ |
| 45 | (45) | ○ | ○ | ○ | ○ | ○ | ○ | ○ |
| 46 | (46) | ○ | ○ | ○ | ○ | ○ | ○ | ○ |
| 47 | (47) | ○ | ○ | ○ | ○ | ○ | ○ | ○ |
| 48 | (48) | ○ | ○ | ○ | ○ | ○ | ○ | ○ |
| 49 | (49) | ○ | ○ | ○ | ○ | ○ | ○ | ○ |
| 50 | (50) | ○ | ○ | ○ | ○ | ○ | ○ | ○ |
| 51 | (51) | ○ | ○ | ○ | ○ | ○ | ○ | ○ |
| 52 | (52) | ○ | ○ | ○ | ○ | ○ | ○ | ○ |
| 53 | (53) | ○ | ○ | ○ | ○ | ○ | ○ | ○ |
| 54 | (54) | ○ | ○ | ○ | ○ | ○ | ○ | ○ |
| 55 | (55) | ○ | ○ | ○ | ○ | ○ | ○ | ○ |
| 56 | (56) | ○ | ○ | ○ | ○ | ○ | ○ | ○ |
| 57 | (57) | ○ | ○ | ○ | ○ | ○ | ○ | ○ |
| 58 | (58) | ○ | ○ | ○ | ○ | ○ | ○ | ○ |

TABLE 9-continued

| Example No. | Nonreducing sugar-containing Developer No. | Immediately after start | \multicolumn{6}{c}{Development of Non-Image Area Throughput (m$^2$)} | | | | | |
|---|---|---|---|---|---|---|---|---|
| | | | 50 | 100 | 200 | 300 | 400 | 500 |
| 59 | (59) | ○ | ○ | ○ | ○ | ○ | ○ | ○ |
| 60 | (60) | ○ | ○ | ○ | ○ | ○ | ○ | ○ |
| Comparative Ex. 2 | (62) | ○ | ○ | Δ | Δ | Δ | X | X |

TABLE 10

| Example No. | SiO$_2$-containing Developer No. | Immediately after start | \multicolumn{6}{c}{Development of Non-Image Area Throughput (m$^2$)} | | | | | |
|---|---|---|---|---|---|---|---|---|
| | | | 50 | 100 | 200 | 300 | 400 | 500 |
| 61 | (1) | ○ | ○ | ○ | ○ | ○ | ○ | ○ |
| 62 | (2) | ○ | ○ | ○ | ○ | ○ | ○ | ○ |
| 63 | (3) | ○ | ○ | ○ | ○ | ○ | ○ | ○ |
| 64 | (4) | ○ | ○ | ○ | ○ | ○ | ○ | ○ |
| 65 | (5) | ○ | ○ | ○ | ○ | ○ | ○ | ○ |
| 66 | (6) | ○ | ○ | ○ | ○ | ○ | ○ | ○ |
| 67 | (7) | ○ | ○ | ○ | ○ | ○ | ○ | ○ |
| 68 | (8) | ○ | ○ | ○ | ○ | ○ | ○ | ○ |
| 69 | (9) | ○ | ○ | ○ | ○ | ○ | ○ | ○ |
| 70 | (10) | ○ | ○ | ○ | ○ | ○ | ○ | ○ |
| 71 | (11) | ○ | ○ | ○ | ○ | ○ | ○ | ○ |
| 72 | (12) | ○ | ○ | ○ | ○ | ○ | ○ | ○ |
| 73 | (13) | ○ | ○ | ○ | ○ | ○ | ○ | ○ |
| 74 | (14) | ○ | ○ | ○ | ○ | ○ | ○ | ○ |
| 75 | (15) | ○ | ○ | ○ | ○ | ○ | ○ | ○ |
| 76 | (16) | ○ | ○ | ○ | ○ | ○ | ○ | ○ |
| 77 | (17) | ○ | ○ | ○ | ○ | ○ | ○ | ○ |
| 78 | (18) | ○ | ○ | ○ | ○ | ○ | ○ | ○ |
| 79 | (19) | ○ | ○ | ○ | ○ | ○ | ○ | ○ |
| 80 | (20) | ○ | ○ | ○ | ○ | ○ | ○ | ○ |
| 81 | (21) | ○ | ○ | ○ | ○ | ○ | ○ | ○ |
| 82 | (22) | ○ | ○ | ○ | ○ | ○ | ○ | ○ |
| 83 | (23) | ○ | ○ | ○ | ○ | ○ | ○ | ○ |
| 84 | (24) | ○ | ○ | ○ | ○ | ○ | ○ | ○ |
| 85 | (25) | ○ | ○ | ○ | ○ | ○ | ○ | ○ |
| 86 | (26) | ○ | ○ | ○ | ○ | ○ | ○ | ○ |
| 87 | (27) | ○ | ○ | ○ | ○ | ○ | ○ | ○ |
| 88 | (28) | ○ | ○ | ○ | ○ | ○ | ○ | ○ |
| 89 | (29) | ○ | ○ | ○ | ○ | ○ | ○ | ○ |
| 90 | (30) | ○ | ○ | ○ | ○ | ○ | ○ | ○ |
| Comparative Ex. 3 | (61) | Δ | X | X | X | X | X | X |

TABLE 11

| Example No. | Nonreducing sugar-containing Developer No. | Impairment of Image Area Immediately after start | Throughput (m²) 50 | 100 | 200 | 300 | 400 | 500 |
|---|---|---|---|---|---|---|---|---|
| 91 | (31) | ○ | ○ | ○ | ○ | ○ | ○ | ○ |
| 92 | (32) | ○ | ○ | ○ | ○ | ○ | ○ | ○ |
| 93 | (33) | ○ | ○ | ○ | ○ | ○ | ○ | ○ |
| 94 | (34) | ○ | ○ | ○ | ○ | ○ | ○ | ○ |
| 95 | (35) | ○ | ○ | ○ | ○ | ○ | ○ | ○ |
| 96 | (36) | ○ | ○ | ○ | ○ | ○ | ○ | ○ |
| 97 | (37) | ○ | ○ | ○ | ○ | ○ | ○ | ○ |
| 98 | (38) | ○ | ○ | ○ | ○ | ○ | ○ | ○ |
| 99 | (39) | ○ | ○ | ○ | ○ | ○ | ○ | ○ |
| 100 | (40) | ○ | ○ | ○ | ○ | ○ | ○ | ○ |
| 101 | (41) | ○ | ○ | ○ | ○ | ○ | ○ | ○ |
| 102 | (42) | ○ | ○ | ○ | ○ | ○ | ○ | ○ |
| 103 | (43) | ○ | ○ | ○ | ○ | ○ | ○ | ○ |
| 104 | (44) | ○ | ○ | ○ | ○ | ○ | ○ | ○ |
| 105 | (45) | ○ | ○ | ○ | ○ | ○ | ○ | ○ |
| 106 | (46) | ○ | ○ | ○ | ○ | ○ | ○ | ○ |
| 107 | (47) | ○ | ○ | ○ | ○ | ○ | ○ | ○ |
| 108 | (48) | ○ | ○ | ○ | ○ | ○ | ○ | ○ |
| 109 | (49) | ○ | ○ | ○ | ○ | ○ | ○ | ○ |
| 110 | (50) | ○ | ○ | ○ | ○ | ○ | ○ | ○ |
| 111 | (51) | ○ | ○ | ○ | ○ | ○ | ○ | ○ |
| 112 | (52) | ○ | ○ | ○ | ○ | ○ | ○ | ○ |
| 113 | (53) | ○ | ○ | ○ | ○ | ○ | ○ | ○ |
| 114 | (54) | ○ | ○ | ○ | ○ | ○ | ○ | ○ |
| 115 | (55) | ○ | ○ | ○ | ○ | ○ | ○ | ○ |
| 116 | (56) | ○ | ○ | ○ | ○ | ○ | ○ | ○ |
| 117 | (57) | ○ | ○ | ○ | ○ | ○ | ○ | ○ |
| 118 | (58) | ○ | ○ | ○ | ○ | ○ | ○ | ○ |
| 119 | (59) | ○ | ○ | ○ | ○ | ○ | ○ | ○ |
| 120 | (60) | ○ | ○ | ○ | ○ | ○ | ○ | ○ |
| Comparative Ex. 4 | (62) | Δ | X | X | X | X | X | X |

TABLE 12

| Example No. | SiO₂-containing Developer No. | Insoluble Matter in Developer — Throughput (plate m²/L) | | | | | | | | |
|---|---|---|---|---|---|---|---|---|---|---|
| | | Storage Temperature 5° C. | | | 20~25° C. | | | 35° C. | | |
| | | 1 | 10 | 100 | 1 | 10 | 100 | 1 | 10 | 100 |
| 61 | (1) | ○ | ○ | ○ | ○ | ○ | ○ | ○ | ○ | ○ |
| 62 | (2) | ○ | ○ | ○ | ○ | ○ | ○ | ○ | ○ | ○ |
| 63 | (3) | ○ | ○ | ○ | ○ | ○ | ○ | ○ | ○ | ○ |
| 64 | (4) | ○ | ○ | ○ | ○ | ○ | ○ | ○ | ○ | ○ |
| 65 | (5) | ○ | ○ | ○ | ○ | ○ | ○ | ○ | ○ | ○ |
| 66 | (6) | ○ | ○ | ○ | ○ | ○ | ○ | ○ | ○ | ○ |
| 67 | (7) | ○ | ○ | ○ | ○ | ○ | ○ | ○ | ○ | ○ |
| 68 | (8) | ○ | ○ | ○ | ○ | ○ | ○ | ○ | ○ | ○ |
| 69 | (9) | ○ | ○ | ○ | ○ | ○ | ○ | ○ | ○ | ○ |
| 70 | (10) | ○ | ○ | ○ | ○ | ○ | ○ | ○ | ○ | ○ |
| 71 | (11) | ○ | ○ | ○ | ○ | ○ | ○ | ○ | ○ | ○ |
| 72 | (12) | ○ | ○ | ○ | ○ | ○ | ○ | ○ | ○ | ○ |
| 73 | (13) | ○ | ○ | ○ | ○ | ○ | ○ | ○ | ○ | ○ |
| 74 | (14) | ○ | ○ | ○ | ○ | ○ | ○ | ○ | ○ | ○ |
| 75 | (15) | ○ | ○ | ○ | ○ | ○ | ○ | ○ | ○ | ○ |
| 76 | (16) | ○ | ○ | ○ | ○ | ○ | ○ | ○ | ○ | ○ |
| 77 | (17) | ○ | ○ | ○ | ○ | ○ | ○ | ○ | ○ | ○ |
| 78 | (18) | ○ | ○ | ○ | ○ | ○ | ○ | ○ | ○ | ○ |
| 79 | (19) | ○ | ○ | ○ | ○ | ○ | ○ | ○ | ○ | ○ |
| 80 | (20) | ○ | ○ | ○ | ○ | ○ | ○ | ○ | ○ | ○ |
| 81 | (21) | ○ | ○ | ○ | ○ | ○ | ○ | ○ | ○ | ○ |
| 82 | (22) | ○ | ○ | ○ | ○ | ○ | ○ | ○ | ○ | ○ |
| 83 | (23) | ○ | ○ | ○ | ○ | ○ | ○ | ○ | ○ | ○ |
| 84 | (24) | ○ | ○ | ○ | ○ | ○ | ○ | ○ | ○ | ○ |
| 85 | (25) | ○ | ○ | ○ | ○ | ○ | ○ | ○ | ○ | ○ |
| 86 | (26) | ○ | ○ | ○ | ○ | ○ | ○ | ○ | ○ | ○ |
| 87 | (27) | ○ | ○ | ○ | ○ | ○ | ○ | ○ | ○ | ○ |
| 88 | (28) | ○ | ○ | ○ | ○ | ○ | ○ | ○ | ○ | ○ |
| 89 | (29) | ○ | ○ | ○ | ○ | ○ | ○ | ○ | ○ | ○ |
| 90 | (30) | ○ | ○ | ○ | ○ | ○ | ○ | ○ | ○ | ○ |
| Comparative Ex. 3 | (61) | X | X | X | Δ | X | X | ○ | Δ | X |

TABLE 13

Insoluble Matter in Developer

| Example No. | Non-reducing sugar-containing Developer No. | Throughput (plate m²/L) | | | | | | | | |
|---|---|---|---|---|---|---|---|---|---|---|
| | | Storage Temperature 5° C. | | | 20~25° C. | | | 35° C. | | |
| | | 1 | 10 | 100 | 1 | 10 | 100 | 1 | 10 | 100 |
| 91 | (31) | O | O | O | O | O | O | O | O | O |
| 92 | (32) | O | O | O | O | O | O | O | O | O |
| 93 | (33) | O | O | O | O | O | O | O | O | O |
| 94 | (34) | O | O | O | O | O | O | O | O | O |
| 95 | (35) | O | O | O | O | O | O | O | O | O |
| 96 | (36) | O | O | O | O | O | O | O | O | O |
| 97 | (37) | O | O | O | O | O | O | O | O | O |
| 98 | (38) | O | O | O | O | O | O | O | O | O |
| 99 | (39) | O | O | O | O | O | O | O | O | O |
| 100 | (40) | O | O | O | O | O | O | O | O | O |
| 101 | (41) | O | O | O | O | O | O | O | O | O |
| 102 | (42) | O | O | O | O | O | O | O | O | O |
| 103 | (43) | O | O | O | O | O | O | O | O | O |
| 104 | (44) | O | O | O | O | O | O | O | O | O |
| 105 | (45) | O | O | O | O | O | O | O | O | O |
| 106 | (46) | O | O | O | O | O | O | O | O | O |
| 107 | (47) | O | O | O | O | O | O | O | O | O |
| 108 | (48) | O | O | O | O | O | O | O | O | O |
| 109 | (49) | O | O | O | O | O | O | O | O | O |
| 110 | (50) | O | O | O | O | O | O | O | O | O |
| 111 | (51) | O | O | O | O | O | O | O | O | O |
| 112 | (52) | O | O | O | O | O | O | O | O | O |
| 113 | (53) | O | O | O | O | O | O | O | O | O |
| 114 | (54) | O | O | O | O | O | O | O | O | O |
| 115 | (55) | O | O | O | O | O | O | O | O | O |
| 116 | (56) | O | O | O | O | O | O | O | O | O |
| 117 | (57) | O | O | O | O | O | O | O | O | O |
| 118 | (58) | O | O | O | O | O | O | O | O | O |
| 119 | (59) | O | O | O | O | O | O | O | O | O |
| 120 | (60) | O | O | O | O | O | O | O | O | O |
| Comparative Ex. 4 | (62) | X | X | X | Δ | X | X | O | Δ | X |

According to the method for preparing a lithographic printing plate of the present invention, the alkaline liquid developer used can exhibit a certain performance, even if components of an image-forming layer dissolve into the developer; and the alkaline liquid developer can favorably disperse developing sludge originated from components in an image-forming layer and suppress the occurrence of insoluble matter in a processing tank, thus the developing process can prevent the developing sludge from adhering to the surface of plate and it is possible to perform a stable processing procedure in extended periods of time. The plate making process of the present invention can form a highly sharp and clear image in a lithographic printing plate without damages to the image areas, simultaneously favorable development performance to the non-image areas being retained.

In addition, according to the method of the present invention, during the plate to be processed is conveyed in an automatic processor, the alkaline liquid developer used does not tend to spatter or ripple and so a stable developing treatment is accomplished. Such spatter and ripple of a developer affect possible the development on a plate adversely.

What is claimed is:

1. A method for preparing a lithographic printing plate comprising the steps of imagewise light-exposing to infrared radiation, a positive-working presensitized plate for use in making a lithographic printing plate, said presensitized plate having an image-forming layer which comprises an IR-absorbing agent and an alkali-soluble resin having a phenolic group, and developing the light-exposing plate with an alkaline liquid developer comprising a polyhydric alcohol-type alkylene oxide adduct in an amount of from 0.001 to 10% by weight, said polyhydric alcohol-type alkylene oxide adduct being selected from the group consisting of the compounds represented by the following formula (I):

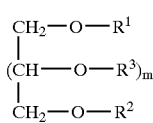

$$CH_2-O-R^1$$
$$(CH-O-R^3)_m$$
$$CH_2-O-R^2$$
(I)

wherein m represents an integer of from 1 to 4, $R^1$, $R^2$ and $R^3$ represent each independently hydrogen atom or a group of formula (II):

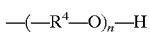

$$-(-R^4-O)_n-H$$
(II)

(wherein $R^4$ represents an alkylene group and n represents an integer such that the total number of moles of addition alkyleneoxides in the compound of the formula (I) is from 12 to 40), and when m is 2 or more, the 2 or more of $R^3$ are the same or different, provided that at least one of $R^1$, $R^2$ and $R^3$ represents the group of formula (II), said image-forming layer further comprising an alkali-soluble high molecular weight compound having a carboxyl group and having as a basic skeleton, a reaction product of a diol compound having a carboxyl group represented by the following general formula (V), (VI) or (VII) and a diisocyanate compound represented by the following formula (X):

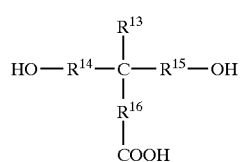

(V)
$$HO-R^{14}-\underset{\underset{COOH}{|}}{\underset{R^{16}}{|}}{\overset{R^{13}}{\underset{|}{C}}}-R^{15}-OH$$

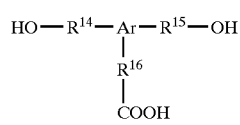

(VI)
$$HO-R^{14}-\underset{\underset{COOH}{|}}{\underset{R^{16}}{|}}Ar-R^{15}-OH$$

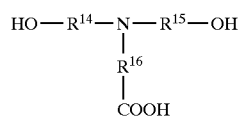

(VII)
$$HO-R^{14}-\underset{\underset{COOH}{|}}{\underset{R^{16}}{|}}N-R^{15}-OH$$

wherein $R^{13}$ represents hydrogen atom, or an alkyl, alkenyl, aralkyl, aryl, alkoxy or aryloxy group which may have a substituent; $R^{14}$, $R^{15}$ and $R^{16}$, which may be the same or different, each represent a single bond, a bivalent aliphatic or aromatic hydrocarbon group which may have a substituent, two or three of $R^{13}$, $R^{14}$, $R^{15}$ and $R^{16}$ may form a ring together, and Ar represents a trivalent aromatic hydrocarbon group which may have a substituent,

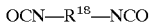

$$OCN-R^{18}-NCO$$
(X)

wherein $R^{18}$ represents a bivalent aliphatic or aromatic hydrocarbon group which may have a substituent.

2. The method of claim 1, wherein the polyhydric alcohol-type alkylene oxide adduct is selected from the group consisting of the compounds represented by the formula (I) wherein m is 4.

3. The method of claim 1 wherein the developer has a pH value of from 12.5 to 14.0.

4. A method for preparing a lithographic printing plate comprising the steps of imagewise light-exposing to infrared radiation, a positive-working presensitized plate for use in making a lithographic printing plate, said presensitized plate having an image-forming layer which comprises an IR-absorbing agent and an alkali-soluble resin having a phenolic group, and developing the light-exposing plate with an alkaline liquid developer comprising a polyhydric alcohol-type alkylene oxide adduct in an amount of from 0.001 to 10% by weight, said polyhydric alcohol-type alkylene oxide adduct being selected from the group consisting of the compounds represented by the following formula (I):

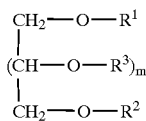
(I)

wherein m represents an integer of from 1 to 4, $R^1$, $R^2$ and $R^3$ represent each independently hydrogen atom or a group of formula (II):

(II)

(wherein $R^4$ represents an alkylene group and n represents an integer such that the total number of moles of addition alkyleneoxides in the compound of the formula (I) is from 12 to 40), and when m is 2 or more, the 2 or more of $R^3$ are the same or different, provided that at least one of $R^1$, $R^2$ and $R^3$ represents the group of formula (II), said image-forming layer further comprising an alkali-soluble high molecular weight compound having a carboxyl group and a thermally decomposable onium salt.

5. The method of claim 4, wherein the polyhydric alcohol-type alkylene oxide adduct is selected from the group consisting of the compounds represented by the formula (I) wherein m is 4.

6. The method of claim wherein 4 wherein the developer has a pH value of from 12.5 to 14.0.

7. The method of claim 4 wherein the alkali-soluble high molecular weight compound having a carboxyl group has a polymerizable monomer unit represented by the following general formula (III):

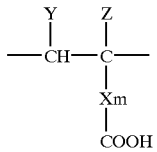
(III)

wherein Xm represents a single bond or a bivalent connecting group, Y represents hydrogen atom or a carboxyl group, and Z represents hydrogen atom, alkyl or carboxyl group.

8. The method of claim 4 wherein the onium salt is a diazonium salt.

* * * * *